(12) United States Patent
Yosoku et al.

(10) Patent No.: US 8,996,965 B2
(45) Date of Patent: Mar. 31, 2015

(54) ERROR CORRECTING DECODING DEVICE AND ERROR CORRECTING DECODING METHOD

(75) Inventors: Naoya Yosoku, Kanagawa (JP); Shutai Okamura, Cupertino, CA (US)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 131 days.

(21) Appl. No.: 13/814,219

(22) PCT Filed: Aug. 3, 2011

(86) PCT No.: PCT/JP2011/004396
§ 371 (c)(1),
(2), (4) Date: Feb. 4, 2013

(87) PCT Pub. No.: WO2012/017652
PCT Pub. Date: Feb. 9, 2012

(65) Prior Publication Data
US 2013/0139038 A1    May 30, 2013

(30) Foreign Application Priority Data
Aug. 6, 2010   (JP) ................................ 2010-177538

(51) Int. Cl.
*H03M 13/00*   (2006.01)
*H03M 13/13*   (2006.01)
*H03M 13/11*   (2006.01)

(52) U.S. Cl.
CPC .......... *H03M 13/13* (2013.01); *H03M 13/1137* (2013.01); *H03M 13/116* (2013.01);
(Continued)

(58) Field of Classification Search
CPC ..................... H03M 13/1111; H03M 13/1131; H03M 13/1137; H03M 13/6362; H03M 13/152; H03M 13/1165

USPC .......... 375/259, 341, 265; 714/780, 758, 792, 714/755, 794, 796
See application file for complete search history.

(56) References Cited

U.S. PATENT DOCUMENTS 5,181,207 A * 1/1993 Chapman ...................... 714/755
6,628,723 B1 * 9/2003 Gerlach et al. ................ 375/259
(Continued)

FOREIGN PATENT DOCUMENTS

JP    2007110265 A    4/2007
JP    2007215089 A    8/2007
(Continued)

OTHER PUBLICATIONS

Wadayama, "Low Density Parity Check Code and Decoding Method," Tricepts Publishing, Jun. 5, 2002, pp. 92-99.
(Continued)

*Primary Examiner* — David Ton
(74) *Attorney, Agent, or Firm* — Seed IP Law Group PLLC

(57) ABSTRACT

The error correcting decoding device of the present invention performs Low-Density Parity-Check (LDPC) decoding which accommodates a plurality of code rates while sharing circuits to suppress increase in circuit scale. If the set code rate is a second code rate which is a higher code rate than a first code rate, a column processing and row processing calculating unit (120A) uses a distributed submatrix in which a number of columns are selected and combined, wherein the number of columns is equal in number to the number of columns with which a first submatrix is constructed from a distributed check matrix corresponding to a second check matrix which accommodates the second code rate. At this time, the column processing and row processing calculating unit (120A) uses a distributed submatrix such that the row degree is less than or equal to the row degree of the first submatrix.

9 Claims, 15 Drawing Sheets

(52) U.S. Cl.
CPC ........ *H03M13/1188* (2013.01); *H03M 13/616*
(2013.01); *H03M 13/6527* (2013.01); *H03M*
*13/1111* (2013.01); *H03M 13/1131* (2013.01)
USPC ........................... 714/780; 714/794; 714/796

(56) References Cited

U.S. PATENT DOCUMENTS

| | | | | |
|---|---|---|---|---|
| 6,999,531 | B2* | 2/2006 | Jin | 375/341 |
| 7,180,952 | B1* | 2/2007 | Gerlach et al. | 375/259 |
| 7,224,743 | B2* | 5/2007 | Holmes et al. | 375/265 |
| 7,421,638 | B2* | 9/2008 | Hewitt et al. | 714/755 |
| 8,286,050 | B2 | 10/2012 | Murakami et al. | |
| 2004/0170236 | A1* | 9/2004 | Kajita et al. | 375/341 |
| 2007/0192670 | A1 | 8/2007 | Ikeda et al. | |
| 2011/0113300 | A1 | 5/2011 | Murakami et al. | |
| 2012/0324309 | A1 | 12/2012 | Murakami et al. | |

FOREIGN PATENT DOCUMENTS

| | | |
|---|---|---|
| JP | 2008011078 A | 1/2008 |
| JP | 2009060453 A | 3/2009 |
| JP | 2009147541 A | 7/2009 |

OTHER PUBLICATIONS

International Search report dated Sep. 13, 2011, for corresponding International Application No. PCT/JP2011/004396, 4 pages.

Liu et al.,"An LDPC Decoder Chip Based on Self-Routing Network for IEEE 802.16e Applications," IEEE Journal of Solid-State Circuits 43(3):684-694, Mar. 2008.

Extended European Search Report, dated Aug. 28, 2013, for corresponding European Application No. 11814289.2-1907, 5 pages.

* cited by examiner

| ROW NUMBER (m) \ COLUMN NUMBER (n) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | – | – | – | – | – | – | – | – | – | – | – | – | – | – | – |
| 1 | – | – | 4 | 5 | – | – | 6 | 7 | – | – | – | – | – | – | – | – |
| 2 | 8 | 9 | – | – | 10 | 11 | – | – | – | – | – | – | – | – | – | – |
| 3 | – | – | 12 | 13 | – | – | 14 | 15 | – | – | – | – | – | – | – | – |
| 4 | 16 | 17 | – | – | 18 | – | – | 19 | – | – | – | – | – | – | – | – |
| 5 | – | – | 20 | 21 | – | 22 | 23 | – | – | – | – | – | – | – | – | – |
| 6 | 24 | – | – | 25 | 26 | – | – | 27 | – | – | – | – | – | – | – | – |
| 7 | – | 28 | 29 | – | – | 30 | 31 | – | – | – | – | – | – | – | – | – |

| COLUMN NUMBER | 0 | 1 | 2 | 3 | | 4 | 5 | 6 | 7 | | 8 | 9 | 10 | 12 | | 11 | 13 | 14 | 15 |
|---|---|---|---|---|---|---|---|---|---|---|---|---|---|---|---|---|---|---|---|
| | 0 | 1 | – | – | | 16 | – | 24 | – | | 32 | – | – | – | | – | – | – | – |
| | – | – | 8 | 9 | | 17 | – | – | 28 | | 33 | 36 | – | – | | – | – | – | – |
| | – | 4 | 5 | 12 | | – | 20 | – | 29 | | – | 37 | 39 | – | | – | – | – | – |
| | 2 | – | – | 13 | | – | 21 | 25 | – | | – | – | 40 | 45 | | 42 | – | – | – |
| | 3 | – | 10 | – | | – | 22 | 26 | – | | 34 | 38 | – | – | | 43 | – | – | – |
| | – | 6 | 11 | 14 | | – | 23 | – | 30 | | – | – | 41 | – | | 44 | 47 | 49 | – |
| | – | 7 | – | 15 | | 19 | – | 27 | 31 | | 35 | – | – | 46 | | – | 48 | 50 | 51 |

PARTIAL MATRIX #1-0 | PARTIAL MATRIX #1-1 | PARTIAL MATRIX #1-2 | PARTIAL MATRIX #1-3

DECODING ORDER: 0, 1, 2, 3

*Note: The above table is an approximate reconstruction. The actual figure shows four partial matrices arranged horizontally:*

PARTIAL MATRIX #1-0 (columns 0-3):
- Row 4: 0, 1, –, –
- Row 5: –, –, 8, 9
- Row 6: –, 4, 5, 12
- Row 7: 2, –, –, 13
- (additional rows): 3, –, 10, –; –, 6, 11, 14; –, 7, –, 15

PARTIAL MATRIX #1-1 (columns 4-7):
- 16, –, 24, –
- 17, –, –, 28
- –, 20, –, 29
- –, 21, 25, 26
- 18, 22, 26, –
- –, 23, –, 30
- 19, –, 27, 31

PARTIAL MATRIX #1-2 (columns 8-10, 12):
- 32, –, –, –
- 33, 36, –, –
- –, 37, 39, –
- –, –, 40, 45
- 34, 38, –, –
- –, –, 41, –
- 35, –, –, 46

PARTIAL MATRIX #1-3 (columns 11, 13-15):
- –, –, –, –
- –, –, –, –
- –, –, –, –
- 42, –, –, –
- 43, –, –, –
- 44, 47, 49, –
- –, 48, 50, 51

DECODING ORDER: 0 → 1 → 2 → 3

| row m \ col n | 0 | 1 | 2 | 3 | 4 | 5 |
|---|---|---|---|---|---|---|
| 0 | 10 | 11 | 12 | 13 | - | - |
| 1 | 14 | 15 | - | - | 16 | 17 |
| 2 | 18 | - | 19 | 20 | - | - |
| 3 | 21 | 22 | - | - | 23 | 24 |
| 4 | 25 | - | 26 | - | - | 27 |
| 5 | 28 | 29 | - | 30 | 31 | - |
| 6 | 32 | 33 | 34 | - | - | 35 |
| 7 | 36 | 37 | - | 38 | 39 | - |
| 8 | - | 40 | 41 | - | - | 42 |
| 9 | 43 | 44 | - | 45 | 46 | - |
| 10 | 47 | 48 | - | - | 49 | - |
| 11 | - | 50 | 51 | 52 | - | - |
| 12 | - | - | 53 | 54 | - | - |
| 13 | - | - | - | 55 | 56 | - |
| 14 | - | - | - | - | 57 | 58 |
| 15 | - | - | - | - | - | 59 |

ERROR CORRECTING DECODING DEVICE AND ERROR CORRECTING DECODING METHOD

TECHNICAL FIELD

The present invention relates to an error correcting decoding apparatus and an error correcting decoding method using low-density parity check (LDPC) code.

BACKGROUND ART

In recent years, LDPC code is becoming a focus of attention as error correcting code that yields high error correcting performance. LDPC code is error correction code defined by a low-density parity check matrix.

Since the LDPC code has high error correcting performance and can be easily mounted, the LDPC code is being considered as an error correcting coding scheme for an IEEE802.11n high speed wireless LAN (Local Area Network) system, digital broadcasting system or large-capacity storage apparatus or the like.

One example of a conventional LDPC code decoding apparatus is disclosed in Patent Literature 1. The decoding apparatus described in Patent Literature 1 is a decoding apparatus adaptable to a plurality of check matrices and classifies check matrices so that edges are included in a unit region. Here, the "edge" refers to element "1" of a check matrix. In the case of LDPC code in binary notation, elements of a check matrix are "0" or "1." The "elements of a matrix" represent components of the matrix. The decoding apparatus described in Patent Literature 1 stores edge arrangement information of edges located in a classified group and thereby reduces the memory capacity. Furthermore, Patent Literature 1 describes a method of simplifying connections between memory and calculation processors using the edge arrangement information.

CITATION LIST

Patent Literature

PTL 1
Japanese Patent Application Laid-Open No. 2007-215089

Non-Patent Literature

NPL 1
"Low-Density Parity Check Code and Decoding Method" Tadashi Wadayama, Triceps Publishing, Jun. 5, 2002 (PP. 92-99)

SUMMARY OF INVENTION

Technical Problem

However, the conventional configuration requires as many calculation processors mounted for a decoding process as row weight×the number of simultaneously processed rows. For this reason, a decoding apparatus adaptable to a plurality of check matrices requires a number of calculation processors that can support a check matrix having the largest row weight, resulting in a problem of increasing the circuit scale.

The present invention has been implemented in view of such a problem, and it is an object of the present invention to provide an error correcting decoding apparatus and an error correcting decoding method capable of performing LDPC decoding adaptable to a plurality of code rates while sharing circuits to suppress an increase in the circuit scale.

Solution to Problem

An aspect of an error correcting decoding apparatus of the present invention is an error correcting decoding apparatus that decodes a coded bit which is subjected to low-density parity check code of a code rate selected from among a plurality of code rates by using a check matrix adaptable to the selected code rate, the apparatus including a storage section that stores a likelihood obtained by receiving the coded bit, a calculation section that calculates a soft decision value by repeating column processing and row processing using the likelihood and a partial matrix corresponding to the check matrix adaptable to the selected code rate, and a decision section that decides the decoded bit using the soft decision value, in which the calculation section uses, when the selected code rate is a first code rate, a first partial matrix obtained by selecting and combining arbitrary columns from a first check matrix adaptable to the first code rate in accordance with the number of columns to be decoded in the column processing as the partial matrix, and uses, when the selected code rate is a second code rate greater than the first code rate, a distributed partial matrix obtained by selecting and combining arbitrary columns from a distributed check matrix in accordance with a second check matrix adaptable to the second code rate as the partial matrix in accordance with the number of columns making up the first partial matrix, and the distributed check matrix is a matrix in which the number of rows of the second check matrix is expanded so that elements of a row with a great row weight of the second check matrix are arranged to be distributed across the original row and the expanded row.

An aspect of an error correcting decoding method of the present invention is an error correcting decoding method for decoding a coded bit which is subjected to low-density parity check code of a code rate selected from among a plurality of code rates by using a check matrix adaptable to the selected code rate, the method including storing a likelihood obtained by receiving the coded bit, calculating a soft decision value by repeating column processing and row processing using the likelihood and a partial matrix corresponding to the check matrix adaptable to the selected code rate, and deciding a decoded bit using the soft decision value, in which when the selected code rate is a first code rate, a first partial matrix selected and combined from a first check matrix adaptable to the first code rate in accordance with the number of columns to be decoded in the column processing is used as the partial matrix, and when the selected code rate is a second code rate greater than the first code rate, a distributed partial matrix selected and combined from a distributed check matrix in accordance with a second check matrix adaptable to the second code rate in accordance with the number of columns making up the first partial matrix is used as the partial matrix, and the distributed check matrix is a matrix in which the number of rows of the second check matrix is expanded so that elements of a row with a large number of row weight of the second check matrix are arranged to be distributed across the original row and the expanded row.

According to these aspects of the present invention, it is possible to perform LDPC decoding adaptable to a plurality of code rates while sharing circuits to suppress an increase in the circuit scale.

Advantageous Effects of Invention

According to the present invention, it is possible to perform LDPC decoding adaptable to a plurality of code rates while sharing circuits to suppress an increase in the circuit scale.

BRIEF DESCRIPTION OF DRAWINGS

FIG. 1 is a diagram illustrating an example of a check matrix as a sharing source according to an embodiment of the present invention;

FIG. 2 is a diagram illustrating an example of a partial matrix as a sharing source in the above embodiment;

FIG. 5 is a diagram illustrating an example of a check matrix as a sharing target in the above embodiment;

FIG. 6 is a diagram illustrating an example of a partial matrix as a sharing target in the above embodiment;

FIG. 7 is a diagram illustrating an example of a distributed check matrix in the above embodiment;

FIG. 8 is a diagram illustrating an example of a distributed partial matrix in the above embodiment;

DESCRIPTION OF EMBODIMENTS

Hereinafter, an embodiment of the present invention will be described in detail with reference to the accompanying drawings.

Embodiment

The present embodiment will describe an error correcting decoding apparatus (hereinafter abbreviated as "decoder") and an error correcting decoding method (hereinafter referred to as "LDPC decoding method or decoding algorithm") capable of performing LDPC decoding adaptable to a plurality of code rates while sharing circuits to suppress an increase in the circuit scale.

First, an LDPC decoding method adaptable to a code rate arbitrarily selected from among a plurality of code rates will be described.

Figure 14:
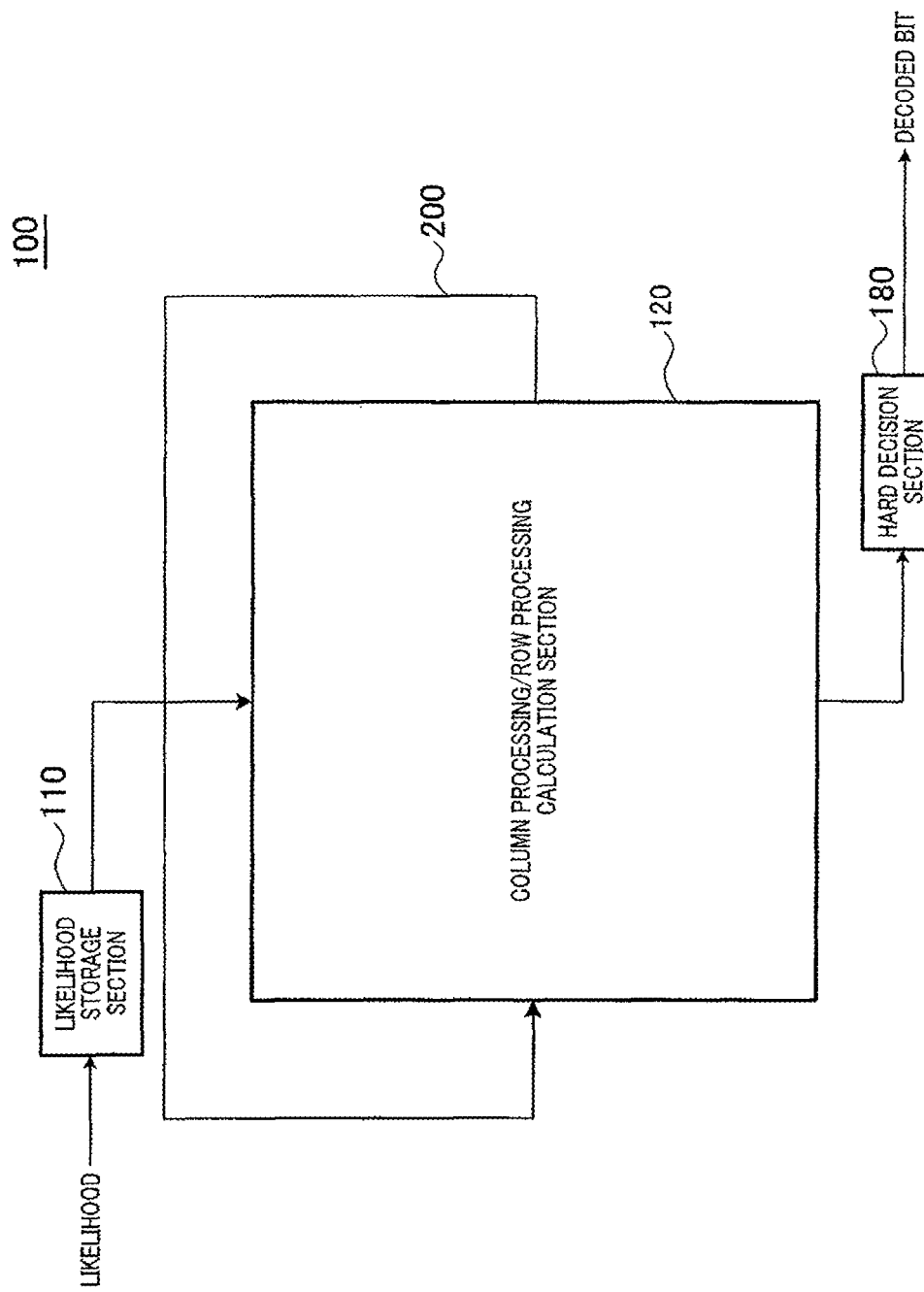
FIG. 14 is a diagram illustrating a configuration of an LDPC decoding apparatus adaptable to a code rate arbitrarily selected from among a plurality of code rates.

Decoder 100C shown in FIG. 14 represents a configuration of an LDPC decoding apparatus adaptable to a code rate arbitrarily selected from among a plurality of code rates. Information called "likelihood" obtained from a received signal is inputted to decoder 100C. The likelihood inputted is temporarily stored in likelihood storage section 110. Column processing/row processing calculation section 120 reads the likelihood stored in likelihood storage section 110 and performs a decoding process.

Column processing/row processing calculation section 120 outputs extrinsic value 200 which is information obtained in the decoding process. Column processing/row processing calculation section 120 reuses outputted extrinsic value 200 as an input signal. In FIG. 14, extrinsic value 200 is once outputted from column processing/row processing calculation section 120, but extrinsic value 200 need not always be outputted, and column processing/row processing calculation section 120 may also internally process extrinsic value 200.

Column processing/row processing calculation section 120 repeatedly performs the decoding process (iterative decoding process) using extrinsic value 200 and the read likelihood. After repeating the decoding process a predetermined number of iteration times, column processing/row processing calculation section 120 outputs a prior value to hard decision section 180. Hard decision section 180 makes a hard decision on the inputted prior value and outputs a decoded bit. Details of the likelihood, extrinsic value 200 and prior value are described in Non-Patent Literature 1.

Details of the LDPC decoding method in column processing/row processing calculation section 120 will be described below.

FIG. 1 is a diagram illustrating a check matrix of LDPC code adaptable to a code rate arbitrarily selected from among a plurality of code rates.

In FIG. 1, a portion enclosed by a rectangular frame corresponds to a submatrix, and a first check matrix is configured by combining a plurality of submatrices. This submatrix is a matrix resulting from cyclically shifting a unit matrix, and a numerical value enclosed by the rectangular frame in FIG. 1 represents the amount of cyclic shift of the unit matrix.

For example, the amount of cyclic shift "0" at row 0 and column 0 represents the unit matrix itself, and the amount of cyclic shift "9" at row 1 and column 2 represents a matrix resulting from cyclically shifting the unit matrix by 9. On the other hand, "-" represents a zero matrix and is not a matrix resulting from cyclically shifting the unit matrix.

A submatrix whose unit matrix has a size of 4×4 and whose amount of cyclic shift is 2 is expressed as shown in equation 1. As is clear from equation 1, a submatrix whose amount of cyclic shift is 2 is a matrix resulting from shifting element "1" of the unit matrix to the right by 2.

[1]

$$I_2 = \begin{bmatrix} 0 & 0 & 1 & 0 \\ 0 & 0 & 0 & 1 \\ 1 & 0 & 0 & 0 \\ 0 & 1 & 0 & 0 \end{bmatrix} \quad \text{(Equation 1)}$$

Hereinafter, a case will be described as an example where the submatrix in the check matrix in FIG. 1 has a size of 64×64. At this time, for example, a submatrix at row 0 and column 2 is a matrix resulting from cyclically shifting a 64×64 unit matrix to the right by 8, and a submatrix at 2 rows and 3 columns is a matrix resulting from cyclically shifting the 64×64 unit matrix to the right by 12.

Since the number of columns of the check matrix in FIG. 1 is 16, its code length is 16×64=1024 and since the number of rows is 8, its parity length is 8×64=512. Thus, its information bit length is 512 bits and the check matrix in FIG. 1 is a check matrix having a code rate of ½ (R=½). Although the code rate and the check matrix in the present embodiment are not particularly limited, the present embodiment will be described using the check matrix having the code rate of ½ shown in FIG. 1 as an example.

In the present embodiment, LDPC decoding corresponding to a check matrix is not performed on all columns of the check matrix all at once, but performed by dividing all the columns into blocks of a certain number of columns. To be more specific, in the present embodiment, a check matrix is divided into a plurality of submatrices, and a decoding process is performed for each partial matrix.

As an example, a case will be considered below where LDPC decoding corresponding to the check matrix in FIG. 1 composed of 16 columns is performed on four columns at a time.

FIG. 2 is a diagram illustrating submatrices used when performing a decoding process on four columns at a time. FIG. 2 is an example where columns numbered as shown in FIG. 1 are selected and combined as {0,1,2,3}, {4,5,6,7}, {8,9,10,12} and {11,13,14,15} to form submatrices. In the example shown in FIG. 1, a check matrix composed of 16 columns is divided into submatrices each composed of 4 columns. Column number 12 is selected for partial matrix #1-2, and column number 11 is selected for partial matrix #1-3.

A criteria for column selection in order to form submatrices from a check matrix is as follows.

In the present embodiment, columns are selected from a check matrix to generate submatrices so that row weights of the submatrices is minimized. In FIG. 2, every row weight corresponding to each row of each partial matrix is set to 2 or below. Here, the "row weight" represents the number of elements "1" in each row of a matrix. That is, when the row weight is 2, this represents that two elements "1" exist when the number of elements "1" of the matrix is counted in the row direction. In FIG. 2 is represented that the number of submatrices in which the amount of cyclic shift is described is 2 or below in all rows.

When the decoding process is performed on two columns at a time, submatrices are formed by focusing, for example, on column numbers 9, 12 and 13 in the check matrix in FIG. 1 and by selecting two columns at a time as {0, 1}, {2, 3}, {4, 5}, {6, 7}, {8, 10}, {9, 12}, {11, 14} and {13, 15}. It is thereby possible to set the row weights to 1. The setting of the number of columns that make up a partial matrix, that is, the number of columns on which the decoding process is performed collectively will be described later.

Thus, in the present embodiment, submatrices are generated from a check matrix by selecting columns so that row weights of the partial matrices is minimized according to the number of columns on which a decoding process is performed, that is, the number of columns making up the submatrix.

In the present embodiment, the following decoding process is performed after forming submatrices according to the above-described column selection. A case will be described below where, for example, logarithmic region min-sum decoding is used as the present decoding algorithm. Details of the logarithmic region min-sum decoding can be obtained by referring to Non-Patent Literature 1. In the present embodiment, the logarithmic region min-sum decoding is performed as follows.

Table 1 shows definitions of variables used for the present decoding algorithm.

TABLE 1

| Name of variables | Notation | Details |
|---|---|---|
| Number-of-times of update | $i$ | Number of times of update processed in LDPC decoding |
| Row number | $m$ (0, 1, . . . , 7 in FIG.1) | Row number that identifies submatrix as shown in FIG.1 |
| Column number | $n$ (0, 1, . . . , 15 in FIG.1) | Column number that identifies submatrix as shown in FIG.1 |
| In-submatrix index | $z$ (0, 1, . . . , 63 in case of submatrix of 64 × 64) | Number that identifies row or column in submatrix |
| Logarithmic likelihood ratio | $\lambda(n, z)$ | Logarithmic likelihood ratio corresponding to LDPC coded bit (logarithmic likelihood ratio corresponding to 1024 (= 16 × 64) bits in present embodiment). Corresponds to z-th column of submatrix in n-th column. |
| Output soft decision value | $\Lambda_s(n, z)$ | Represented by defining output soft decision value corresponding to LDPC coded bit, as z-th column of submatrix in n-th column. |
| Output hard decision value | $\Lambda_h(n, z)$ | Value resulting from making hard decision on output soft decision value |
| Logarithmic extrinsic value ratio (extrinsic value corresponding to z-th row of submatrix on m-th row in i-th update processing) | $\alpha_{min}(i, m, z)$ | Minimum value of absolute value of logarithmic extrinsic value ratio when extrinsic value is updated |
| | $\alpha_{2nd}(i, m, z)$ | Absolute value of second smallest logarithmic extrinsic value ratio when extrinsic value is updated |
| | $\alpha_{ind}(i, m, z)$ | Column number of submatrix that provides minimum value of absolute value of logarithmic extrinsic value ratio when extrinsic value is updated |
| | $\alpha_{sig}(i, m, z)$ | Sign of logarithmic extrinsic value ratio |
| Logarithmic prior value ratio | $\beta(m, n, z)$ | Logarithmic prior value ratio corresponding to z-th column of submatrix on m-th row, n-th column |
| | $\beta_{sig}(m, n, z)$ | Sign of logarithmic prior value ratio corresponding to z-th column of submatrix on m-th row, n-th column |

The present decoding algorithm performs column processing based on the unit of the number of columns of a submatrix selected and formed from the check matrix as shown in FIG. 2. Furthermore, the present decoding algorithm successively performs row processing using logarithmic prior value ratios obtained as a result of column processing.

In the example of FIG. 2, the present decoding algorithm performs column processing on every four columns (the number of columns of each partial matrix), four times in total. To be more specific, the present decoding algorithm performs column processing in order of partial matrix #1-0, partial matrix #1-1, partial matrix #1-2, and partial matrix #1-3 shown in FIG. 2. Thus, at a time at which the present decoding algorithm has performed column processing on every four columns (the number of columns of each partial matrix), four times in total, column processing using the check matrix shown in FIG. 1 has been updated once.

Figure 3:
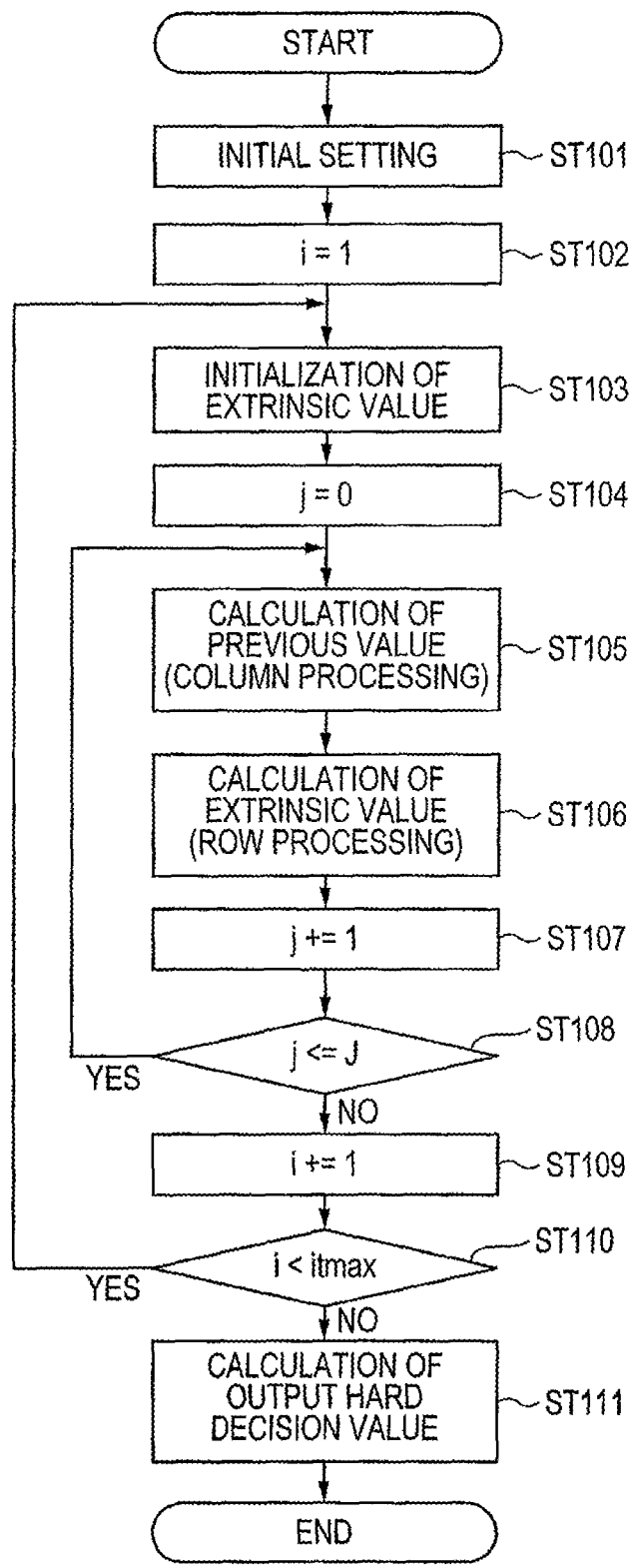
FIG. 3 is a flowchart of a decoding process in the above embodiment.

FIG. 3 is a diagram illustrating a flowchart of an LDPC decoding process according to the present embodiment. Hereinafter, details of the present decoding algorithm will be described using the flowchart shown in FIG. 3.

[1] Start

After obtaining logarithmic likelihood ratios corresponding to all LDPC coded bits (1024 bits in the present embodiment), the present decoding algorithm starts LDPC decoding.

[2] Initial Setting (ST101)

The present decoding algorithm sets the update processing count as the 0-th time. Furthermore, the present decoding algorithm sets logarithmic extrinsic value ratios corresponding to all m and z in the 0-th update processing as follows. In this algorithm, m indicates the row number when the check matrix is represented by submatrices (subblocks) as shown in FIG. 1. Furthermore, z is an index that indicates a row when a submatrix (subblock) selected by m is converted through a cyclic shift on a unit matrix.

The logarithmic extrinsic value (extrinsic value) indicates an improvement of decoding reliability of a bit to be decoded in iterative decoding. Referring to min-sum decoding, the logarithmic extrinsic value is an improvement of reliability obtained through row processing performed using a prior value corresponding to any bits other than bits to be decoded.

[2]

$$\alpha_{min}(0,m,z)=0 \quad \text{(Equation 2-1)}$$

$$\alpha_{2nd}(0,m,z)=0 \quad \text{(Equation 2-2)}$$

$$\alpha_{ind}(0,m,z)=0 \quad \text{(Equation 2-3)}$$

$$\alpha_{sig}(0,m,z)=1 \quad \text{(Equation 2-4)}$$

Furthermore, the present decoding algorithm sets signs of logarithmic prior value ratios for all m, n, z as follows. In this algorithm, n indicates a column number when the check matrix is represented by submatrices (subblocks) as shown in FIG. 1.

[3]

$$\beta_{sig}(m,n,z)=1 \quad \text{(Equation 3)}$$

[3] i=1 (ST102)

The present decoding algorithm sets variable i for counting the number of times of update (hereinafter referred to as "update count") to 1.

[4] Initialization of Extrinsic Value (ST103)

The present decoding algorithm sets the logarithmic extrinsic value ratio in the i-th update processing for all m and z as follows.

[4]

$$\alpha_{min}(i,m,z)=qt_{max}-1 \quad \text{(Equation 4-1)}$$

$$\alpha_{2nd}(i,m,z)=qt_{max} \quad \text{(Equation 4-2)}$$

$$\alpha_{ind}(i,m,z)=0 \quad \text{(Equation 4-3)}$$

$$\alpha_{sig}(i,m,z)=1 \quad \text{(Equation 4-4)}$$

where $qt_{max}$ represents a maximum value in the processing system.

[5] j=0 (ST104)

The present decoding algorithm sets variable j representing the decoding order to 0. Decoding order j is a number assigned to a partial matrix (set of columns to which the decoding process is applied) as shown in FIG. 2.

[6] Calculation of Prior Value (Column Processing) (ST105)

First, the present decoding algorithm obtains input extrinsic value $e_{val}(m, n, z_1)$ to column processing corresponding to a partial matrix for all m, n, $z_0$, from the logarithmic extrinsic value ratio obtained in (i−1)-th update processing as follows.

[5]

$$e_{sig}(m,n,z_1)=\alpha_{sig}(i-1,m,z_0)\times\beta_{sig}(m,n,z_1) \quad \text{(Equation 5)}$$

where Z is a submatrix size, and S(m, n) is the amount of cyclic shift corresponding to the submatrix on the m-th row, n-th column of the check matrix. Furthermore, $z_0=0,\ldots,Z-1$ and $z_1=(S(m, n)+z_0)$ mod Z. Herein, X mod Y represents a remainder of Y divided by X.

[6]

$$e_{abs}(m,n,z_1)=\alpha_{min}(i-1,m,z_0) \text{ (when } \alpha_{ind}(i-1,m,z_0)\neq n\text{)} \quad \text{(Equation 6-1)}$$

$$\alpha_{2nd}(i-1,m,z_0) \text{ (when } \alpha_{ind}(i-1,m,z_0)=n\text{)} \quad \text{(Equation 6-2)}$$

[7]

$$e_{val}(m,n,z_1)=e_{sig}(m,n,z_1)\times e_{abs}(m,n,z_1) \quad \text{(Equation 7)}$$

However, when S(m, n)="-," that is, when the submatrix indicated by S(m, n) is a zero matrix, the present decoding algorithm does not calculate the input extrinsic value, where S(m, n) represents the amount of cyclic shift for a submatrix on the m-th row, n-th column of the check matrix. As the in-submatrix index, index $z_0$ corresponding to the logarithmic extrinsic value ratio differs from index $z_1$ corresponding to the input extrinsic value because the processing order changes due to the cyclic shift of the submatrix.

The present decoding algorithm calculates a logarithmic prior value ratio using the input extrinsic value and the logarithmic likelihood ratio calculated as shown above. The logarithmic prior value ratio is calculated for all m, n, and z as shown in equation 8.

[8]

$$\beta(m, n, z) = \lambda(n, z) + \sum_{m'=0 \lor n}^{M-1} e_{val}(m', n, z) \quad \text{(Equation 8)}$$

where, M represents the number of rows of the submatrix of the check matrix.

In equation 8, Σ is applied to the submatrix except row number m of the submatrix. In equation 8, 0 m indicates a "except row number m." Furthermore, to generate input extrinsic value $e_{val}(m, n, z_1)$ in the next update processing, the sign of the logarithmic prior value ratio is updated as shown in equation 9.

[9]

$$\beta_{sig}(m,n,z)=\text{SIGN}(\beta(m,n,z)) \quad \text{(Equation 9)}$$

where, SIGN(•) is a function that returns a sign.

[7] Calculation of Extrinsic Value (Row Processing) (ST106)

The present decoding algorithm performs successive row processing on a partial matrix made up of a set of submatrices selected as shown in FIG. 2. The row processing in min-sum decoding is a calculation that searches for a minimum value. Thus, the present decoding algorithm compares the logarithmic prior value ratio calculated in [6] with the logarithmic extrinsic value ratios calculated so far, searches for a minimum value of the absolute value and updates the logarithmic extrinsic value ratio with the searched minimum value.

The present decoding algorithm also calculates a column number that provides a minimum value of the absolute value and a value whose absolute value is the second smallest (hereinafter referred to as "second value") as ones for the aforementioned column processing in the minimum value search. Furthermore, the present decoding algorithm also updates the sign of the logarithmic extrinsic value ratio. The row processing can be expressed by the following equations.

[10]

$$\beta_{min}(m, z_1) = \min_{n}(|\beta(m, n, z_1)|) \quad \text{(Equation 10-1)}$$

$$\beta_{ind}(m, z_1) = \min_{n} ind(|\beta(m, n, z_1)|) \quad \text{(Equation 10-2)}$$

where min(•) represents a function that returns a minimum value of the absolute value when the logarithmic prior value ratio corresponding to the column to be decoded is viewed in the row direction.

Furthermore, minind(•) represents a function that returns a column number of the submatrix that provides a minimum value of the absolute value.

[11]

$$z_1 = (S(m,n)+z_0) \bmod Z \quad \text{(Equation 11-1)}$$

$$\alpha_{min}(i,m,z_0) = \min(\alpha_{min}(i,m,z_0), \beta_{min}(m,z_1)) \quad \text{(Equation 11-2)}$$

$$\alpha_{2nd}(i,m,z_0) = \min2(\alpha_{min}(i,m,z_0), \alpha_{2nd}(i,m,z_0), \beta_{min}(m,z_1)) \quad \text{(Equation 11-3)}$$

$$\alpha_{ind}(i,m,z_0) = \minind(\alpha_{ind}(i,m,z_0), \beta_{ind}(m,z_1)) \quad \text{(Equation 11-4)}$$

where min(•) represents a function that returns a minimum value, and min2(•) represents a function that returns a second value. Furthermore, minind(•) is a function that returns R when $\beta_{ind}(m, z_1)$ min function selects $\beta_{min}(m, z_1)$ as the minimum value, and returns $\alpha_{ind}(i, m, z_0)$ otherwise.

[8] j+=1 (ST107)

The present decoding algorithm increments decoding order j by 1.

[9] j<=J (ST108)

The present decoding algorithm returns to "[6] Calculation of prior value" to perform column processing when j is equal to or less than last decoding order J or exits the loop when j exceeds J.

[10] i+=1 (ST109)

The present decoding algorithm increments update count i by 1.

[11] i<itmax (ST110)

The present decoding algorithm returns to "[4] Initialization of extrinsic value" to restart the decoding process when update count i is smaller than maximum update count itmax.

On the other hand, the present decoding algorithm exits the loop when update count i is equal to or greater than maximum update count itmax.

[12] Calculation of Output Hard Decision Value (ST111)

The present decoding algorithm calculates an output soft decision value for all n, z according to the following equation.

[12]

$$\Lambda_s(n, z) = \lambda(n, z) + \sum_{m'=0}^{M-1} e_{val}(m', n, z) \quad \text{(Equation 12)}$$

When calculating the logarithmic prior value ratio, the present decoding algorithm does not add up $e_{val}$ corresponding to a submatrix having row number m to be decoded as shown in equation 8. However, in the calculation of the output soft decision value, the present decoding algorithm also considers the submatrix having row number m to be decoded.

The present decoding algorithm calculates an output hard decision value using the sign of the output soft decision value obtained. The sign of the output soft decision value and the output hard decision value depend on the way for calculating the logarithmic likelihood ratio. When the logarithmic likelihood ratio is calculated as shown in Non-Patent Literature 1, the present decoding algorithm outputs "0" as the decoding result if the sign of the output soft decision value is positive and outputs "1" if the sign is negative. The present decoding algorithm then outputs the decoding result corresponding to the information bit as a decoded bit and ends the LDPC decoding.

Figure 4:
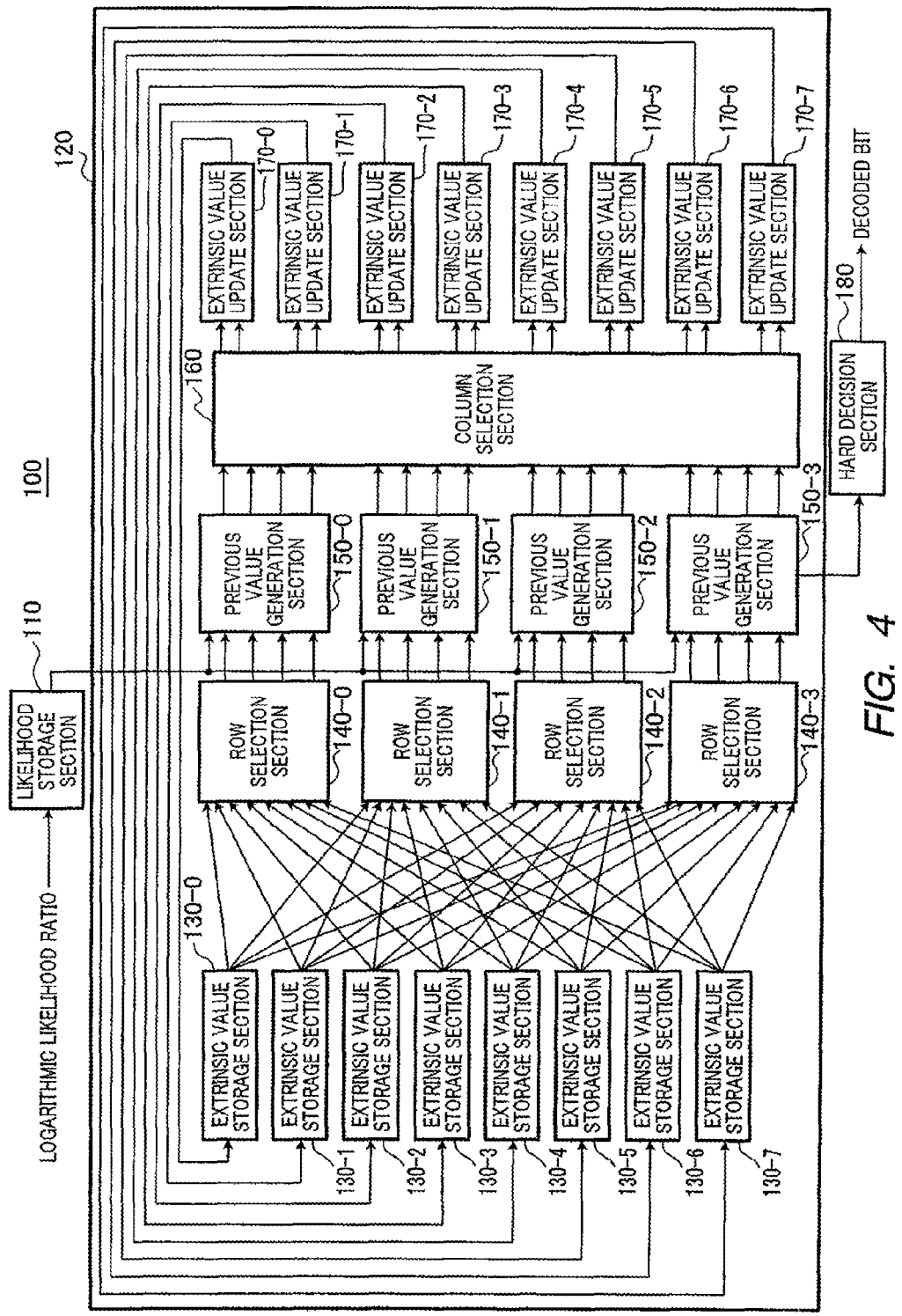
FIG. 4 is a diagram illustrating a configuration of main parts of a decoder as a sharing source according to the above embodiment.

FIG. 4 is a block diagram illustrating a configuration of main parts of the decoder according to the present embodiment. Decoder 100 in FIG. 4 is an error correcting decoding apparatus that performs error correcting decoding by using an LDPC check matrix and performs LDPC decoding based on the flowchart shown in FIG. 3. As an example, FIG. 4 shows a configuration of decoder 100 adaptable to the check matrix shown in FIG. 1. Furthermore, FIG. 4 describes the configuration of decoder 100 using a submatrix as a processing unit for simplicity of description.

Decoder 100 according to the present embodiment includes likelihood storage section 110, column processing/row processing calculation section 120 and hard decision section 180.

Column processing/row processing calculation section 120 includes extrinsic value storage sections 130-0 to 130-7, row selection sections 140-0 to 140-3, prior value generation sections 150-0 to 150-3, column selection section 160 and extrinsic value update sections 170-0 to 170-7.

The partial matrix of the check matrix in FIG. 1 (see FIG. 2) is a matrix of 8 rows×4 columns based on the unit of submatrix. That is, the present decoding algorithm performs row processing in LDPC decoding on 8 rows of submatrices as a unit. Therefore, decoder 100 in FIG. 4 has a configuration including eight extrinsic value storage sections and eight extrinsic value update sections. Furthermore, the present decoding algorithm performs column processing in LDPC decoding on 4 columns of submatrices as a unit. Thus, decoder 100 in FIG. 4 has a configuration including four matrix selection sections and four prior value generation sections.

The number of columns making up a partial matrix is not limited to four, but decoder 100 may have as many matrix selection sections and prior value generation sections as columns making up a partial matrix. Since an increase in the number of columns making up a partial matrix requires the more matrix selection sections and prior value generation sections, the number of columns making up a partial matrix may be set based on a tradeoff with the circuit scale.

Likelihood storage section 110 stores a logarithmic likelihood ratio corresponding to LDPC coded bits, the logarithmic likelihood ratio being obtained from a received signal. When logarithmic likelihood ratios corresponding to all LDPC coded bits are stored in likelihood storage section 110, LDPC decoding starts.

Extrinsic value storage section 130-$k$ ($k$=0 to 7) stores logarithmic extrinsic value ratios which is output from extrinsic value update section 170-$k$ ($k$=0 to 7). When LDPC decoding starts, extrinsic value storage section 130-$k$ ($k$=0 to 7) initializes a logarithmic extrinsic value ratio as mentioned in "[2] Initial setting" of the flowchart.

Extrinsic value storage section 130-$k$ outputs the stored logarithmic extrinsic value ratio to row selection sections 140-0 to 140-3.

Row selection section 140-$r$ ($r$=0 to 3) selects and outputs logarithmic extrinsic value ratios corresponding to rows having non-zero elements (rows in which the amount of cyclic shift is described) in the column of column number r of partial matrix #1-j corresponding to decoding order j shown in FIG. 2 (decoding unit of 4 columns). For example, row selection section 140-0 selects logarithmic extrinsic value ratios corresponding to non-zero elements (rows 0, 1, 4, and 5) of column number 0 of partial matrix #1-0 and outputs the logarithmic extrinsic value ratios to prior value generation section 150-0. Similarly, row selection section 140-1 selects logarithmic extrinsic value ratios corresponding to non-zero elements (rows 2, 3, 6, and 7) of column number 1 of partial matrix #1-0 and outputs the logarithmic extrinsic value ratios to prior value generation section 150-1. Row selection section 140-2 selects logarithmic extrinsic value ratios corresponding to non-zero elements (rows 0, 1, 4, and 5) of column number 2 of partial matrix #1-0 and outputs the logarithmic extrinsic value ratios to prior value generation section 150-2. Row selection section 140-3 selects logarithmic extrinsic value ratios corresponding to non-zero elements (rows 2, 3, 6, and 7) of column number 3 of partial matrix #1-0 and outputs the logarithmic extrinsic value ratios to prior value generation section 150-3.

Prior value generation section 150-$r$ ($r$=0 to 3) calculates logarithmic prior value ratios using the logarithmic extrinsic value ratios which is input from row selection section 140-$r$ and the logarithmic likelihood ratios which is input from likelihood storage section 110 as shown in "[6] Calculation of prior value (column processing)" of the flowchart.

Here, prior value generation section 150-$r$ ($r$=0 to 3) calculates logarithmic prior value ratios corresponding to rows having non-zero elements in the column of column number r of partial matrix #1-j (columns to be decoded). For example, prior value generation section 150-0 calculates logarithmic prior value ratios corresponding to rows (rows 0, 1, 4, and 5) having non-zero elements of column number 0 of partial matrix #1-0 and outputs the calculated logarithmic prior value ratios to column selection section 160. Similarly, prior value generation sections 150-1, 150-2 and 150-3 calculate logarithmic prior value ratios corresponding to non-zero elements of column numbers 1, 2, and 3 of partial matrix #1-j respectively and outputs the calculated logarithmic prior value ratios to column selection section 160.

As shown in equation 8, logarithmic prior value ratios can be obtained by addition. Therefore, prior value generation section 150-$r$ ($r$=0 to 3) includes an adder.

Here, prior value generation section 150-3 performs the decoding process a predetermined number of times (itmax) and then outputs logarithmic prior value ratios to hard decision section 180.

Column selection section 160 selects logarithmic prior value ratios corresponding to non-zero elements in each row of partial matrix #1-j corresponding to decoding order j shown in FIG. 2. For example, a case will be described where column selection section 160 performs the decoding process regarding partial matrix #1-0 corresponding to decoding order 0. At this time, column selection section 160 selects logarithmic prior value ratios corresponding to column numbers 0 and 2 of partial matrix #1-0, regarding the 0-th row of partial matrix #1-0. Column selection section 160 selects logarithmic prior value ratios corresponding to column numbers 0 and 2 of partial matrix #1-0, regarding the first row of partial matrix #1-0. Column selection section 160 selects logarithmic prior value ratios corresponding to column numbers 1 and 3 of partial matrix #1-0, regarding the second row of partial matrix #1-0. Column selection section 160 selects logarithmic prior value ratios corresponding to column numbers 1 and 3 of partial matrix #1-0, regarding the third row of partial matrix #1-0.

Thus, column selection section 160 selects logarithmic prior value ratios corresponding to columns having non-zero elements, regarding each row of partial matrix #1-j as decoding target j, and outputs the selected logarithmic prior value ratios to extrinsic value update section 170-$k$ ($k$=0 to 7).

Extrinsic value update section 170-$k$ ($k$=0 to 7) updates logarithmic extrinsic value ratios corresponding to a k-th row using logarithmic prior value ratios, as "[7] Calculation of extrinsic value (row processing)" of the flowchart. For example, extrinsic value update section 170-0 updates logarithmic extrinsic value ratios corresponding to the 0-th row of partial matrix #1-j. Similarly, extrinsic value update section 170-$k$ ($k$=1 to 7) updates logarithmic extrinsic value ratios corresponding to the k-th row of partial matrix #1-j.

As shown in equations 10-1, 10-2 and equations 11-1 to 11-4, logarithmic extrinsic value ratios can be obtained by comparison. For this reason, extrinsic value update section 170-$k$ ($k$=0 to 7) includes a comparator. The number of comparators required corresponds to a row weight of a partial matrix.

After performing the decoding process a predetermined number of times (itmax), hard decision section 180 makes a hard decision on the logarithmic prior value ratios which is output from prior value generation section 150-3, acquires a hard decision value as a decoded bit and outputs the acquired decoded bit.

FIG. 4 shows the configuration of decoder 100 in which hard decision section 180 makes a hard decision on the logarithmic prior value ratios which is output from prior value generation section 150-3, but the configuration is not limited to this. That is, hard decision section 180 may be configured to make a hard decision on logarithmic prior value ratios which is output from any one of prior value generation sections 150-0, 150-1 and 150-2.

The operation of decoder 100 configured as described above will be described.

A logarithmic likelihood ratio corresponding to an LDPC coded bit is obtained from the received signal and is stored in likelihood storage section 110. When logarithmic likelihood ratios corresponding to all LDPC coded bits are stored, LDPC decoding starts. When LDPC decoding starts, the signs of the logarithmic extrinsic value ratios stored in extrinsic value storage section 130-$k$ ($k$=0 to 7) and the logarithmic prior value ratios stored in prior value generation section 150-*r* (r=0 to 3) are initialized as described in "[2] Initial setting" of the flowchart.

The logarithmic extrinsic value ratios initialized by extrinsic value storage section 130-*k* (k=0 to 7) are inputted to row selection section 140-*r* (r=0 to 3). Row selection section 140-*r* (r=0 to 3) selects and outputs logarithmic extrinsic value ratios corresponding to rows having non-zero elements (rows in which the amount of cyclic shift is described) in the r-th column of the partial matrix (of the decoding unit of 4 columns) shown in FIG. 2.

The selected logarithmic extrinsic value ratios are inputted to prior value generation section 150-*r* (r=0 to 3). Prior value generation section 150-*r* (r=0 to 3) calculates logarithmic prior value ratios using the inputted logarithmic extrinsic value ratios and the logarithmic likelihood ratio inputted from likelihood storage section 110 as shown in "[6] Calculation of prior value (column processing)" of the flowchart. The logarithmic prior value ratios obtained correspond to the rows having non-zero elements among the columns of the partial matrix to be decoded.

The logarithmic prior value ratios outputted from prior value generation section 150-*r* (r=0 to 3) are inputted to column selection section 160. Column selection section 160 selects and outputs logarithmic prior value ratios corresponding to non-zero elements of each row regarding each partial matrix composed of four columns to be decoded shown in FIG. 2. For example, when performing the decoding process on partial matrix #1-1 of decoding order 0, column selection section 160 selects and outputs logarithmic prior value ratios corresponding to column numbers 0 and 2 regarding the 0-th row. Similarly, column selection section 160 selects and outputs logarithmic prior value ratios corresponding to column numbers 0 and 2 regarding the first row. Furthermore, column selection section 160 selects and outputs logarithmic prior value ratios corresponding to column numbers 1 and 3 regarding the second row. Thus, column selection section 160 has the function of selecting and outputting logarithmic prior value ratios corresponding to columns having non-zero elements regarding each row of a partial matrix to be decoded.

The logarithmic prior value ratios corresponding to non-zero elements of each row selected in column selection section 160 are inputted to extrinsic value update section 170-*k* (k=0 to 7). Extrinsic value update section 170-*k* (k=0 to 7) updates a logarithmic extrinsic value ratio corresponding to each row using the inputted logarithmic prior value ratios as shown in "[7] Calculation of extrinsic value (row processing)" of the flowchart. Thus, extrinsic value update section 170-*k* (k=0 to 7) has the function of updating a logarithmic extrinsic value ratio corresponding to each row of a partial matrix to be decoded.

As described above, the decoding process is performed in decoding order j in FIG. 2, that is, performed regarding partial matrix #1-j. When the decoding process regarding decoding order j ends, the decoding process regarding a partial matrix corresponding to next decoding order (j+1) starts ("[8], [9]" in the flowchart).

Thus, decoder 100 performs the decoding process corresponding to decoding order j and updates logarithmic extrinsic value ratios. When last decoding order J (decoding order J=3 in FIG. 2) is completed, extrinsic value update section 170-*k* (k=0 to 7) outputs the updated logarithmic extrinsic value ratio. The outputted logarithmic extrinsic value ratio is inputted to extrinsic value storage section 130-*k* (k=0 to 7). Extrinsic value storage section 130-*k* (k=0 to 7) stores a logarithmic extrinsic value ratio updated in last decoding order J. Decoder 100 performs a similar decoding process again using the updated logarithmic extrinsic value ratios ("[10], [11]" in the flowchart).

Decoder 100 then repeats the decoding process a predetermined number of times (itmax times). After performing the decoding process the predetermined number of times, prior value generation section 150-3 calculates an output soft decision value and outputs the output soft decision value calculated as shown in "[12] Calculation of output hard decision value" of the flowchart.

Hard decision section 180 acquires a hard decision value from the inputted soft decision value and outputs the hard decision value as a decoded bit.

Thus, in the present embodiment, decoder 100 performs decoding for each partial matrix. At this time, the number of logarithmic prior value ratios inputted to extrinsic value update section 170-*k* (k=0 to 7) is the same as a row weight of each partial matrix. Therefore, by dividing the check matrix to form partial matrices so that the row weight becomes a minimum, it is possible to minimize the number of logarithmic prior value ratios inputted to extrinsic value update section 170-*k* (k=0 to 7). This minimizes the number of inputs to a minimum value search and a second value search in "[7] Calculation of extrinsic value (row processing)" of the flowchart and as a result, can minimize the number of comparators making up extrinsic value update section 170-*k* (k=0 to 7).

The LDPC decoding algorithm and the configuration of the decoder adaptable to a code rate (hereinafter referred to as "first code rate") arbitrarily selected from among a plurality of code rates have been descried so far. Next, an LDPC decoding algorithm and a decoder adaptable to a second code rate which is greater than the first code rate will be described.

Figure 15:
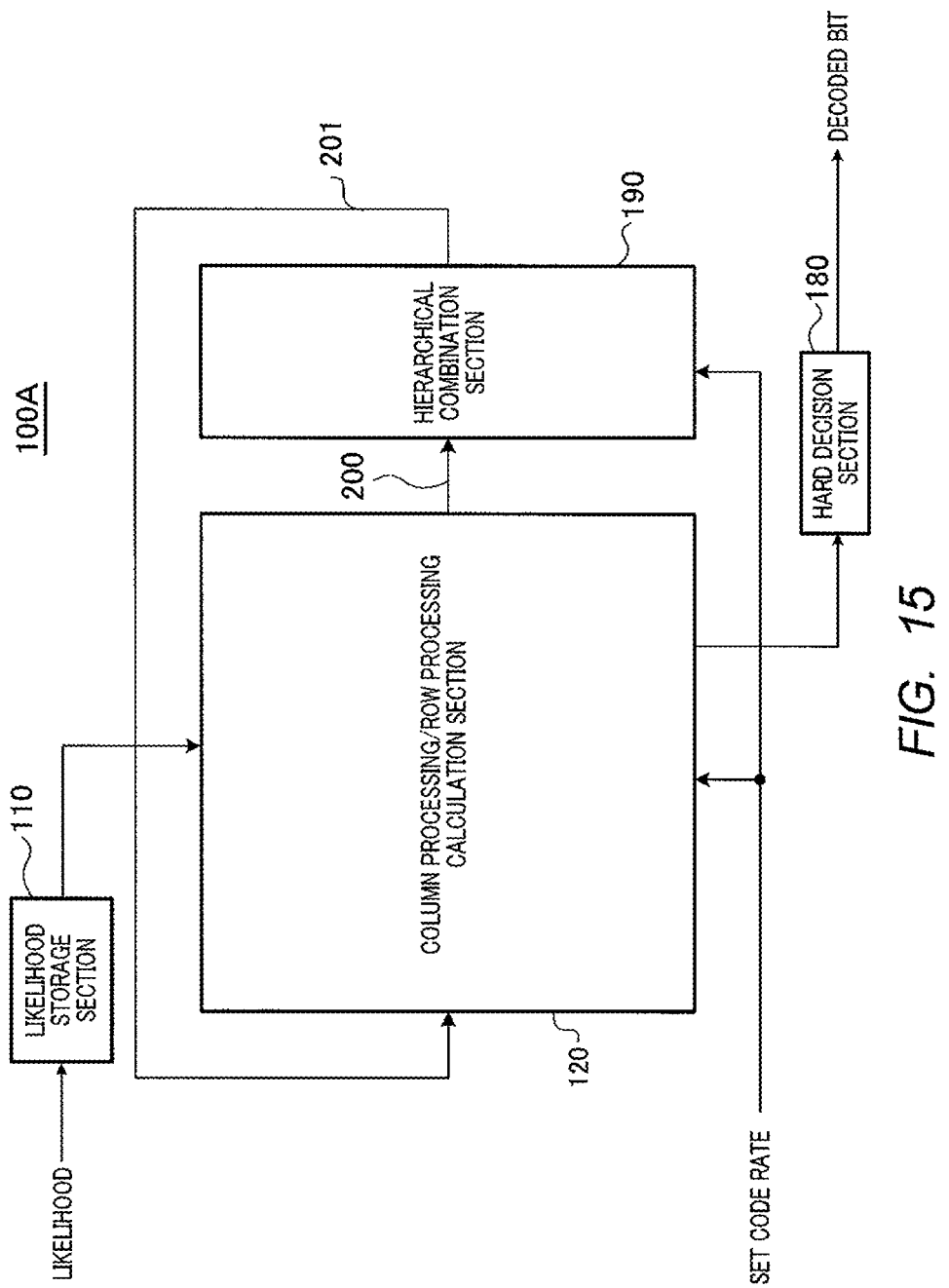
FIG. 15 is a diagram illustrating a configuration of an LDPC decoding apparatus adaptable to a first code rate and a second code rate.

FIG. 15 shows a configuration of decoder 100A which is an LDPC decoding apparatus adaptable to the first code rate and the second code rate. Configuring decoder 100A adaptable to the first code rate and the second code rate requires an input of a set code rate (corresponding to a selected code rate) and hierarchical combination section 190 as shown in FIG. 15. Processing contents of column processing/row processing calculation section 120 and hierarchical combination section 190 are controlled by the set code rate. Details of the decoding process will be described below.

FIG. 5 is a diagram illustrating a check matrix with a second code rate (hereinafter referred to as "second check matrix"). The second check matrix in FIG. 5 is a check matrix having a code rate of 5/8 (R=5/8). The code rate is a value determined by (the number of columns−the number of rows)/(the number of columns), and since the second check matrix is made up of a submatrix set of 6 rows and 16 columns, the code rate of the LDPC code defined by the second check matrix is (16−6)/16=5/8. Here, for the check matrix with the second code rate, a check matrix whose column weight is equal to or less than that of the check matrix with the first code rate (hereinafter referred to as "first check matrix") is used (see FIG. 1 and FIG. 5). In other words, a check matrix whose column weight becomes a maximum is used for the check matrix with the first code rate which becomes the base for circuit sharing.

The column weight represents the maximum number of elements "1" that exist in each column of the check matrix. For example, the column weight of the first check matrix shown in FIG. 1 is 4, the column weight of the second check matrix shown in FIG. 5 is also 4, and therefore the column weight of the second check matrix is equal to or less than the column weight of the first check matrix.

A case will be described below where decoding using the second check matrix is performed when the first check matrix is used for the check matrix which becomes the base for circuit sharing. That is, a case will be described below where decoding corresponding to the second check matrix is performed using decoder 100 adaptable to the first check matrix as the basic configuration while achieving circuit sharing.

To achieve circuit sharing, the decoding algorithm adaptable to the second check matrix in FIG. 5 as well as the first check matrix in FIG. 1 performs the decoding process using a partial matrix obtained by combining arbitrary columns of the second check matrix as a processing unit. Hereinafter, the partial matrix of the first check matrix is called "first partial matrix" and the partial matrix of the second check matrix is called "second partial matrix."

As described above, the number of prior value generation sections 150 required corresponds to the number of columns of the partial matrix. To suppress an increase in the circuit scale and perform decoding adaptable to a plurality of code rates, the present embodiment sets as many columns making up the second partial matrix as columns making up the first partial matrix. This allows prior value generation section 150-$r$ ($r=0$ to 3) to be adaptable to both the first code rate and the second code rate.

Figure 6:
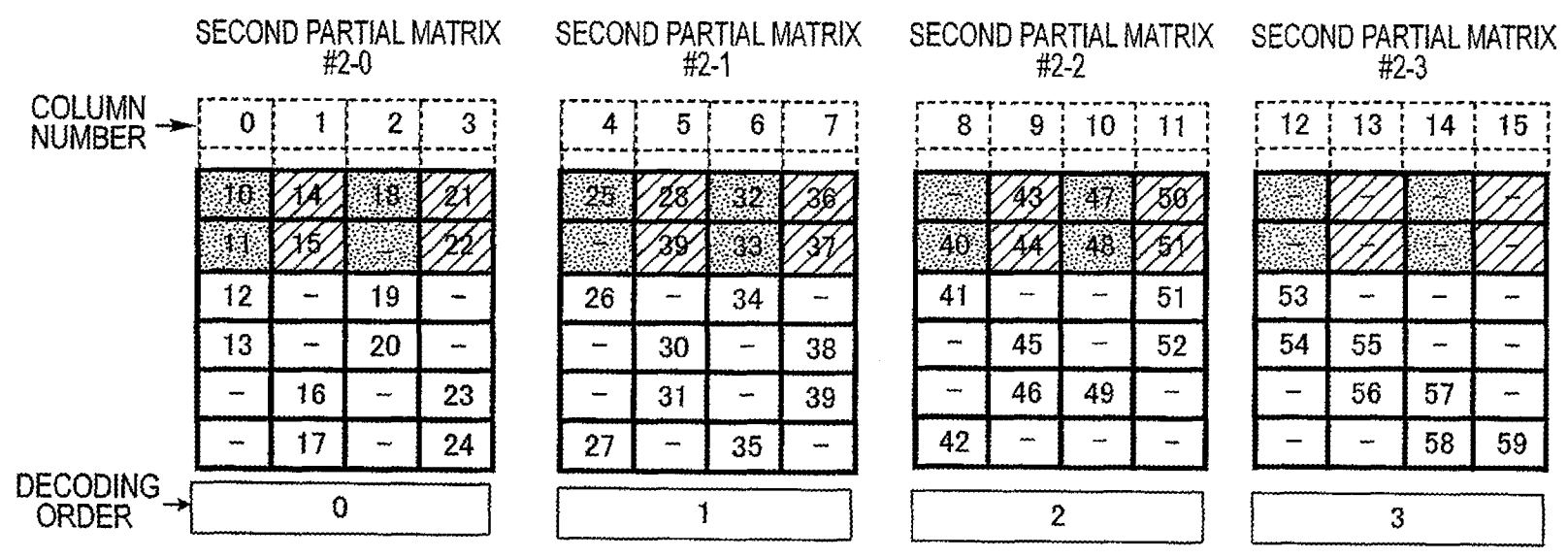

FIG. 6 is a diagram illustrating second partial matrices resulting from dividing the second check matrix in FIG. 5 into blocks of four columns. As shown in FIG. 6, column numbers $\{0, 1, 2, 3\}$ are selected from the second check matrix to form second partial matrix #2-0. Furthermore, column numbers $\{4, 5, 6, 7\}$ are selected from the second check matrix to form second partial matrix #2-1. Furthermore, column numbers $\{8, 9, 10, 11\}$ are selected from the second check matrix to form second partial matrix #2-2. Furthermore, column numbers $\{12, 13, 14, 15\}$ are selected from the second check matrix to form second partial matrix #2-3. Thus, when the number of columns of the second partial matrix is equal to the number of columns of the first partial matrix which is the sharing source, prior value generation section 150-$r$ ($r=0$ to 3) can be adaptable to both the first code rate and the second code rate.

Furthermore, as described above, extrinsic value update section 170-$k$ ($k=0$ to 7) requires the same number of comparators as a row weight of the partial matrix However, as shown in FIG. 6, non-zero elements "10", "14", "18" and "21" which are submatrices having row weights are arranged in the 0-th column, first column, second column and third column in the 0-th row of second partial matrix #2-0 respectively. Therefore, while the row weight of the first partial matrix is 2, the row weight of the 0-th row of second partial matrix #2-0 is 4.

Therefore, to be adaptable to both the first and second partial matrices, extrinsic value update section 170-$k$ ($k=0$ to 7) needs to have four comparators. However, the circuit scale increases as the number of comparators increases.

Thus, the present embodiment distributes submatrices having row weights (that is, non-zero elements) in the second partial matrix so that the number of inputs to extrinsic value update section 170-$k$ ($k=0$ to 7) becomes equal to or less than that when the first partial matrix is used. To be more specific, the number of rows of the second check matrix is expanded and non-zero elements of a row having a larger number of row weight of the second partial matrix are arranged in the expanded rows to distribute the row weights.

Figure 7:
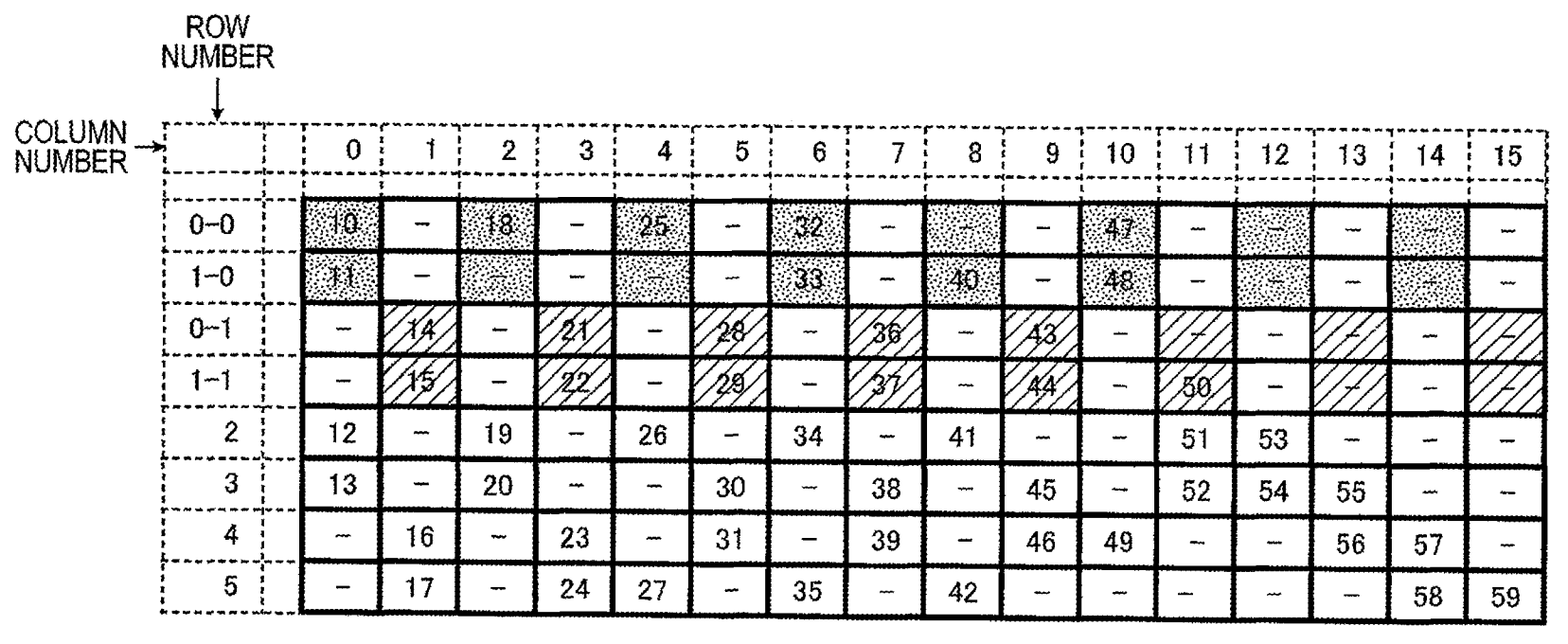

For example, non-zero element "10" in the 0-th column of the 0-th row of second partial matrix #2-0 and non-zero element "14" in the first column of the 0-th row of second partial matrix #2-0 are distributed to different rows. At this time, as shown in FIG. 7, the 0-th row is distributed to the (0-0)-th row and the (0-1)-th row and arranged so that non-zero element "10" in the 0-th column of the 0-th row is included in the (0-0)-th row and non-zero element "14" in the first column of the 0-th row is included in the (0-1)-th row.

Thus, row weights are distributed by expanding the number of rows of the second check matrix and arranging non-zero elements of a row with a larger number of row weights of the second partial matrix in the expanded row. FIG. 7 shows an example where non-zero element "10" in the 0-th column of the 0-th row of the second check matrix and non-zero element "14" in the first row are distributed so as to be included in the (0-0)-th row and the (0-1)-th row respectively.

Hereinafter, a check matrix obtained by expanding the number of rows of the second check matrix and arranging non-zero elements of the row with a larger number of row weights of the second partial matrix in the expanded row will be called "distributed check matrix." Suppose the number of rows of the distributed check matrix is equal to or less than the number of rows of the first check matrix which is the sharing source.

Figure 8:
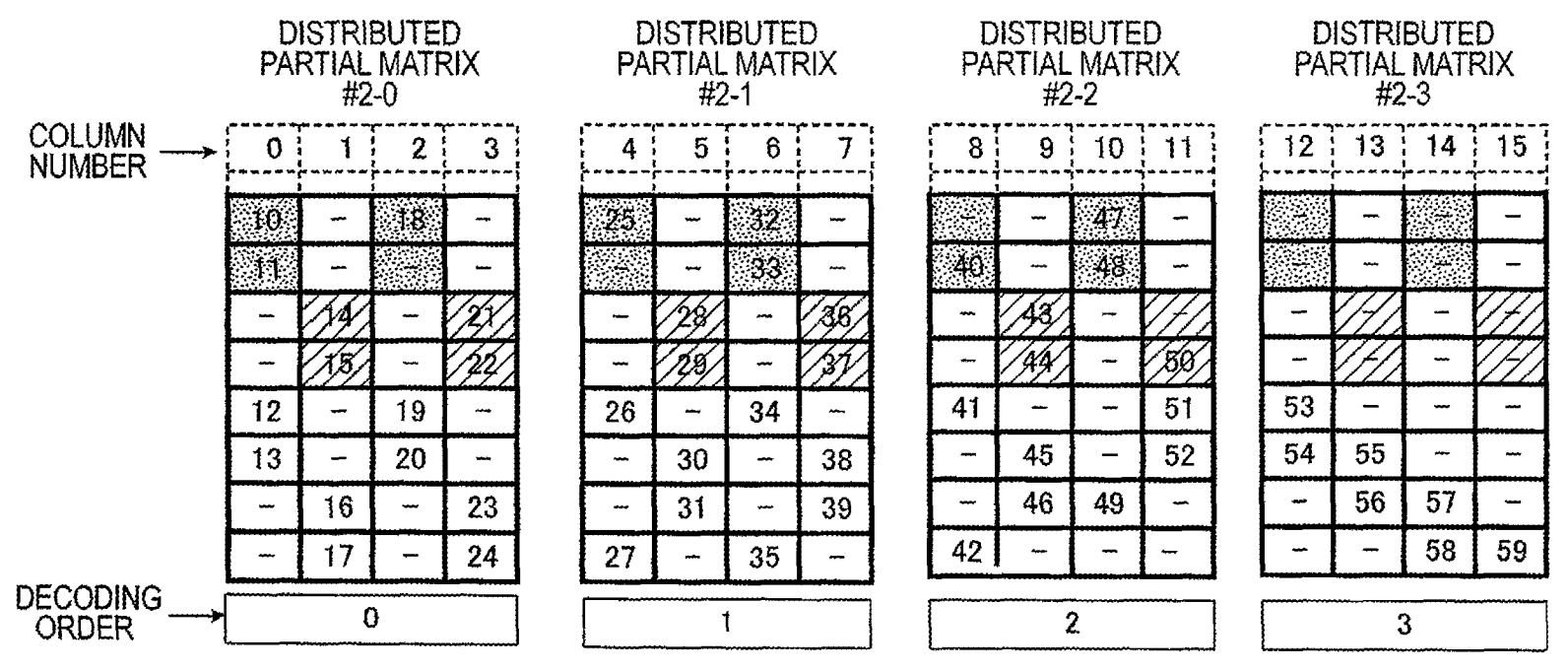

FIG. 8 shows partial matrices after selecting columns to be decoded from the check matrix after distribution (distributed check matrix). By distributing the second check matrix to generate a distributed check matrix, selecting a number of columns corresponding to the number of columns to be decoded from the distributed check matrix to generate partial matrices adaptable to the second code rate (hereinafter referred to as "distributed partial matrices"), it is possible to reduce row weights of the partial matrices to be decoded.

For example, the row weight of distributed partial matrix #2-0 after the distribution is 2 and can be made smaller than row weight 4 of the second partial matrix before the distribution.

As described above, the present embodiment uses the first check matrix whose column weight becomes the largest between the first and second check matrices adaptable to the first and second code rates respectively for the check matrix which becomes the source for circuit sharing (see FIG. 1). That is, the number of non-zero elements included in a certain column of the first partial matrix (partial matrix of the first check matrix which is the sharing source) is equal to or larger than the number of non-zero elements included in a certain column of the second partial matrix. Thus, when the number of rows of the second check matrix which is the sharing target (see FIG. 5) is expanded to distribute row weights, it is possible to make the row weight of the distributed partial matrix to be decoded equal to or less than the row weight of the first partial matrix which is the sharing source.

Figure 9:
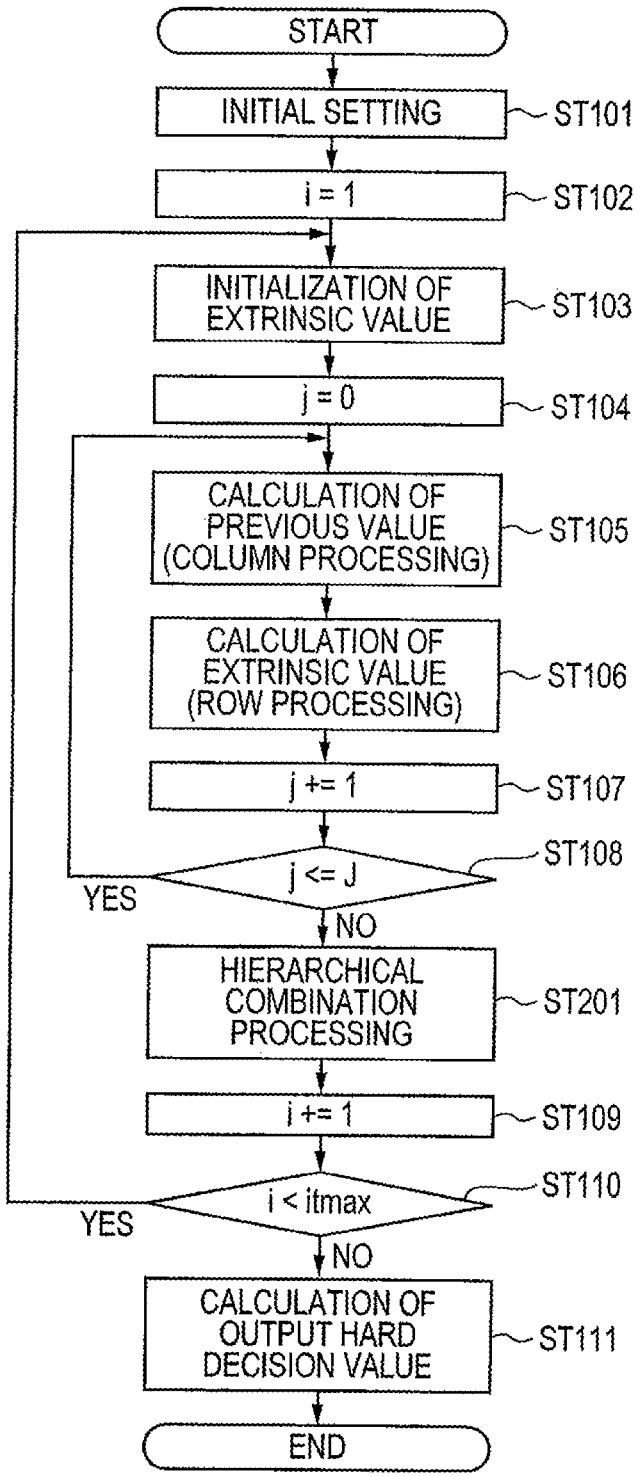
FIG. 9 is a flowchart of the decoding process in the above embodiment.

FIG. 9 is a diagram illustrating a flowchart of the decoding process adaptable to the second check matrix. In FIG. 9, in the same processing steps as those in FIG. 3, the present decoding algorithm performs similar processing using a distributed partial matrix instead of the first partial matrix.

[13] Hierarchical Combination Processing: ST201

In order to be adaptable to the second check matrix, the present decoding algorithm adds hierarchical combination processing after ST108. The present decoding algorithm distributes matrix elements of the check matrix shown in FIG. 5 to the check matrix shown in FIG. 7. Therefore, to be adaptable to the second check matrix, it is necessary to obtain the same value as the logarithmic extrinsic value ratio obtained through decoding using the check matrix in FIG. 5 which is the base. Obtaining the logarithmic extrinsic value ratio of the same value from the distributed check matrix in FIG. 7 requires processing of selecting and outputting the smaller one of the logarithmic extrinsic value ratios corresponding to the two distributed rows. This is defined as hierarchical combination processing and the processing contents thereof are shown in the following equations.

[13]

$$\alpha_{min}(i,m,z)=\min(\alpha_{min}(i,a,z),\alpha_{min}(i,b,z)) \quad \text{(Equation 13-1)}$$

$$\alpha_{2nd}(i,m,z)=\min2(\alpha_{min}(i,a,z),\alpha_{2nd}(i,a,z),\alpha_{min}(i,b,z),\alpha_{2nd}(i,b,z)) \quad \text{(Equation 13-2)}$$

$$\alpha_{ind}(i,m,z)=\text{minind}(\alpha_{ind}(i,a,z),\alpha_{ind}(i,b,z)) \quad \text{(Equation 13-3)}$$

$$\alpha_{sig}(i,m,z)=\alpha_{sig}(i,a,z)\times\alpha_{sig}(i,b,z) \quad \text{(Equation 13-4)}$$

where a and b represent row numbers of the expanded rows obtained by decomposing the m-th row. Furthermore, minind (•) is a function that returns $\alpha_{ind}(i, a, z)$ when a min function selects $\alpha_{min}$ (i, a, z) as a minimum value and returns $\alpha_{ind}(i, b, z)$ otherwise.

The above-described hierarchical combination processing is performed after the column processing and row processing in last decoding order J of maximum update count itmax end (ST108: NO).

The decoding algorithm adaptable to the second check matrix has been described so far.

Next, the configuration of a decoder adaptable to the first code rate and the second code rate will be described.

Figure 10:
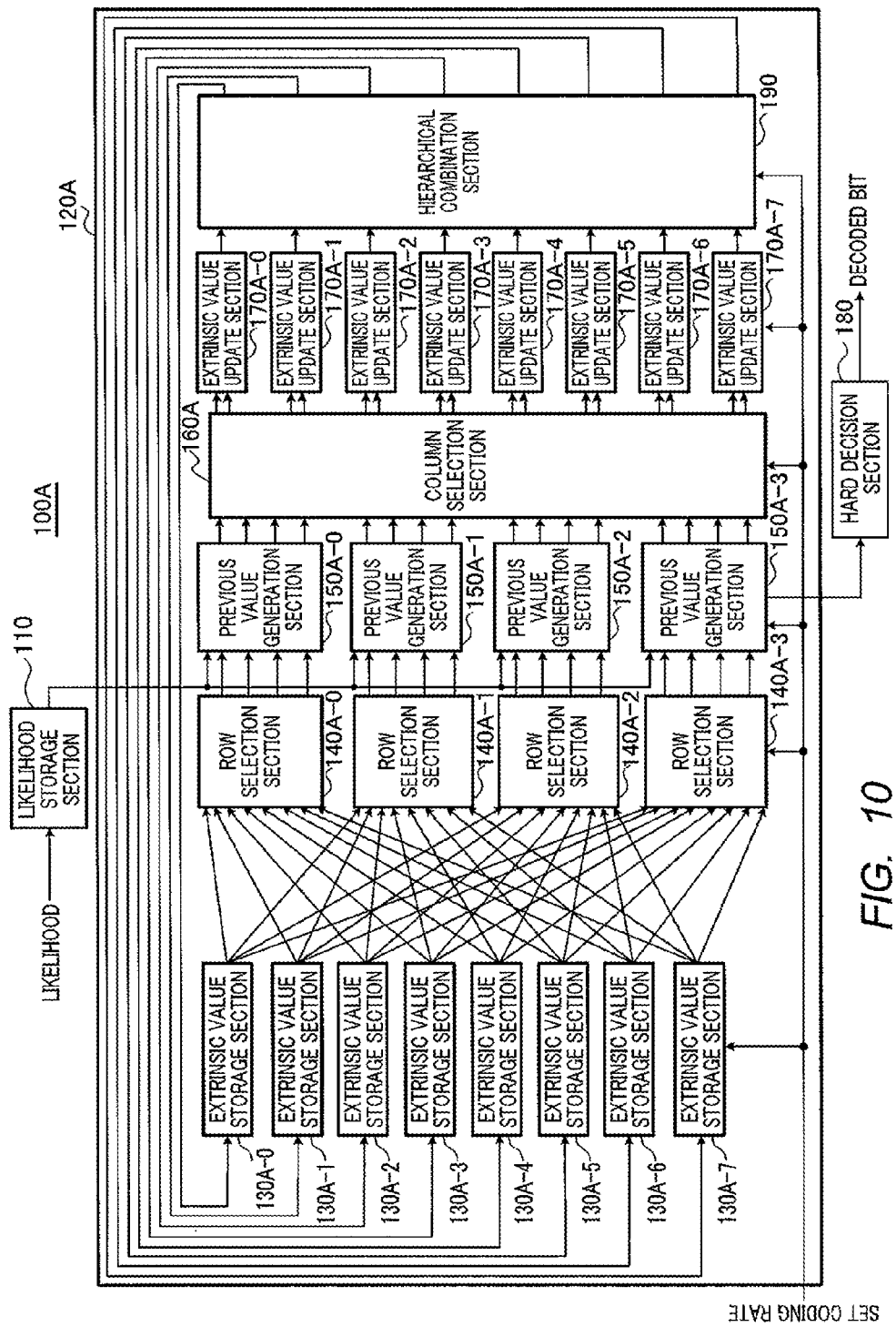
FIG. 10 is a diagram illustrating a configuration of main parts of a shared decoder according to the above embodiment.

FIG. 10 is a block diagram showing a configuration of main parts of the decoder according to the present embodiment. In FIG. 10, components common to those in FIG. 4 are assigned the same reference numerals as those in FIG. 4 and descriptions thereof will be omitted. Compared to decoder 100 in FIG. 4 as the basic configuration, decoder 100A in FIG. 10 includes column processing/row processing calculation section 120A instead of column processing/row processing calculation section 120. Column processing/row processing calculation section 120A has a configuration including column processing/row processing calculation section 120 and hierarchical combination section 190.

Column processing/row processing calculation section 120A includes extrinsic value storage sections 130A-0 to 130A-7, row selection sections 140A-0 to 140A-3, prior value generation sections 150A-0 to 150A-3, column selection section 160A, extrinsic value update sections 170A-0 to 170A-7 and hierarchical combination section 190.

Row selection sections 140A-0 to 140A-3 are different from row selection sections 140-0 to 140-3 in the point that a partial matrix is set to either one of the first partial matrix or the distributed partial matrix according to information of input code rate. Once the partial matrix is set, row selection sections 140A-0 to 140A-3 thereafter select and output logarithmic extrinsic value ratios corresponding to non-zero elements of the corresponding partial matrix as in the case of row selection sections 140-0 to 140-3. In this way, row selection sections 140A-0 to 140A-3 perform row processing adaptable to different code rates.

Prior value generation sections 150A-0 to 150A-3 are different from prior value generation sections 150-0 to 150-3 in that a corresponding partial matrix is set to one of the first partial matrix and the distributed partial matrix according to information on the input code rate. Once the partial matrix is set, prior value generation sections 150A-0 to 150A-3 thereafter shift (rearrange) and output logarithmic prior value ratios according to the amount of cyclic shift of the corresponding partial matrix as in the case of prior value generation sections 150-0 to 150-3. In this way, row selection sections 140A-0 to 140A-3 output logarithmic extrinsic value ratios according to different code rates.

As in the case of prior value generation sections 150-0 to 150-3, prior value generation sections 150A-0 to 150A-3 each have an adder and calculate logarithmic prior value ratios using the adder. As described above, since the first partial matrix and the distributed partial matrix are composed of the same number of columns, decoder 100A needs only to include as many prior value generation sections as columns of the first partial matrix. Therefore, prior value generation sections 150A-0 to 150A-3 made up of adders are sharable with respect to different code rates.

Column selection section 160A is different from column selection section 160 in the point that a corresponding partial matrix is set to either one of the first partial matrix or the distributed partial matrix according to the information of a input code rate. Once the partial matrix is set, column selection section 160A thereafter selects and outputs logarithmic prior value ratios corresponding to non-zero elements of the partial matrix as in the case of column selection section 160. In this way, column selection section 160A performs column processing accommodating different code rates.

Extrinsic value update sections 170A-0 to 170A-7 are different from extrinsic value update sections 170-0 to 170-7 in the point that a corresponding partial matrix is set to either one of the first partial matrix or the distributed partial matrix according to information of a input code rate. Once the partial matrix is set, extrinsic value update sections 170A-0 to 170A-7 update logarithmic extrinsic value ratios corresponding to each row using logarithmic prior value ratios as in the case of extrinsic value update sections 170-0 to 170-7. In this way, extrinsic value update sections 170A-0 to 170A-7 update logarithmic extrinsic value ratios according to different code rates.

The row weight of the check matrix after distribution (distributed check matrix) is equal to or less than the row weight of the check matrix which is the sharing source (first check matrix). Thus, the number of inputs to extrinsic value update sections 170A-0 to 170A-7 is equal to or less than the row weight of the sharing source check matrix, and therefore extrinsic value update sections 170A-0 to 170A-7 can perform row processing for different code rates. That is, comparators making up extrinsic value update sections 170A-0 to 170A-7 are sharable with respect to different code rates.

Hierarchical combination section 190 receives the logarithmic extrinsic value ratios which is output from extrinsic value update sections 170A-0 to 170A-7. Hierarchical combination section 190 performs calculations shown in equations 13-1 to 13-4 using the input logarithmic extrinsic value ratios. Hierarchical combination section 190 performs the calculations shown in equations 13-1 to 13-4 to thereby obtain logarithmic extrinsic value ratios corresponding to the second check matrix before the distribution.

The logarithmic extrinsic value ratios corresponding to the second check matrix as shown in equations 13-1 to 13-4 are obtained by comparison. For that purpose, hierarchical combination section 190 includes a comparator.

Hierarchical combination section 190 distributes logarithmic extrinsic value ratios corresponding to rows of the second check matrix before the distribution as logarithmic extrinsic value ratios corresponding to rows of the distributed check matrix after the distribution and outputs the distributed logarithmic extrinsic value ratios to extrinsic value storage sections 130A-0 to 130A-7.

Extrinsic value storage sections 130A-0 to 130A-7 store the logarithmic extrinsic value ratios outputted from hierarchical combination section 190.

As described above, in the present embodiment, decoder 100A is a decoder that decodes a LDPC coded bit of a code rate selected from among a plurality of code rates by using the check matrix corresponding to its code rate. Column processing/row processing calculation section 120A then repeats column processing and row processing using likelihood and a partial matrix corresponding to the check matrix of its code rate to calculate a soft decision value. To be more specific, when the selected code rate is a first code rate, column processing/row processing calculation section 120A uses the first partial matrix selected and combined from the first check matrix of its first code rate according to the number of columns used in column processing. Here, the number of columns used in the column processing is equal to or more than one and is set in consideration of the circuit scale. On the other hand, when the set code rate is a second code rate, column processing/row processing calculation section 120A uses a distributed partial matrix resulting from selecting and combining the same number of columns as the columns making up the first partial matrix from the distributed check matrix in accordance with the second check matrix adaptable to the second code rate. Here, the second code rate is a code rate greater than the first code rate.

Here, the distributed check matrix is a matrix resulting from expanding the number of rows of the second check matrix, distributing and arranging elements of a row with a larger number of row weight of the second check matrix across the original row and the expanded row. At this time, column processing/row processing calculation section 120A uses a distributed partial matrix whose row weight is equal to or less than the row weight of the first partial matrix.

Thus, the number of logarithmic prior value ratios which is input to extrinsic value update section 170A-k (k=0 to 7) falls to or below a row weight of the first partial matrix regardless of the selected code rate. As a result, it is possible to share a comparator making up extrinsic value update section 170A-k (k=0 to 7) among different code rates (first code rate and second code rate).

Furthermore, in the present embodiment, the first check matrix and distributed check matrix are divided into the first partial matrix and distributed partial matrix, and column processing is performed using the divided first partial matrix and distributed partial matrix as a processing unit. Here, suppose the number of columns of the distributed partial matrix is equal to the number of columns of the first partial matrix. Thus, the number of prior value generation sections 150A-m (m=0 to 3) required is equal to the number of columns making up the first partial matrix and distributed partial matrix regardless of the set code rate. That is, it is possible to share, among different code rates, prior value generation section 150A-m (m=0 to 3) configured using an adder.

Furthermore, extrinsic value storage section 130A-k (k=0 to 7) receives the same number of logarithmic prior value ratios as rows making up the first check matrix as input. For this reason, it is possible to share extrinsic value storage section 130A-k (k=0 to 7) among different code rates by setting the number of rows of the distributed check matrix to a value equal to or less than the number of rows of the first check matrix.

Thus, according to the present embodiment, it is possible to share the storage apparatus (extrinsic value storage section) for logarithmic extrinsic value ratios, the adder (prior value generation section) for calculating logarithmic prior value ratios and the comparator (extrinsic value update section) for updating the logarithmic extrinsic value ratios.

Decoder 100A shown in FIG. 10 adopts a configuration including hierarchical combination section 190 after extrinsic value update section 170A-k (k=0 to 7). In the case of a one-to-one data communication mode in a wireless LAN system or a mobile phone system, the receiver has to send back an acknowledgment response to the transmitter within a specified time after decoding received data. Therefore, in order to send back the acknowledgment response within the specified time, a processing time required for decoding needs to be shorter than at least the specified time. For this reason, the configuration of decoder 100A shown in FIG. 10 provided with hierarchical combination section 190 after extrinsic value update section 170A-k (k=0 to 7) is suitable for use in shortening the time for the decoding process.

On the other hand, in a broadcasting system or in a one-to-multiple multicast data communication mode, the receiver need not send back any acknowledgment response to the transmitter. That is, there is no limitation on a processing delay required for decoding. In such a case, instead of independently providing hierarchical combination section 190, as in the case of decoder 100B shown in FIG. 11, extrinsic value update section 170B-k (k=0 to 7) in column processing/row processing calculation section 120B may be configured so as to perform hierarchical combination processing in addition to updating of logarithmic extrinsic value ratios.

As described above, the extrinsic value update sections and hierarchical combination section are each configured using a comparator. Therefore, the comparator of the extrinsic value update section can also be used for hierarchical combination processing. In this way, using the same comparator as the comparator making up the hierarchical combination section and as the comparator making up the extrinsic value update section makes it possible to reduce the circuit scale of decoder 100B.

Hereinafter, the decoding process in decoders 100A and 100B that adopt the configurations shown in FIG. 10 and FIG. 11 will be described using time charts shown in FIG. 12 and FIG. 13.

Figure 12:
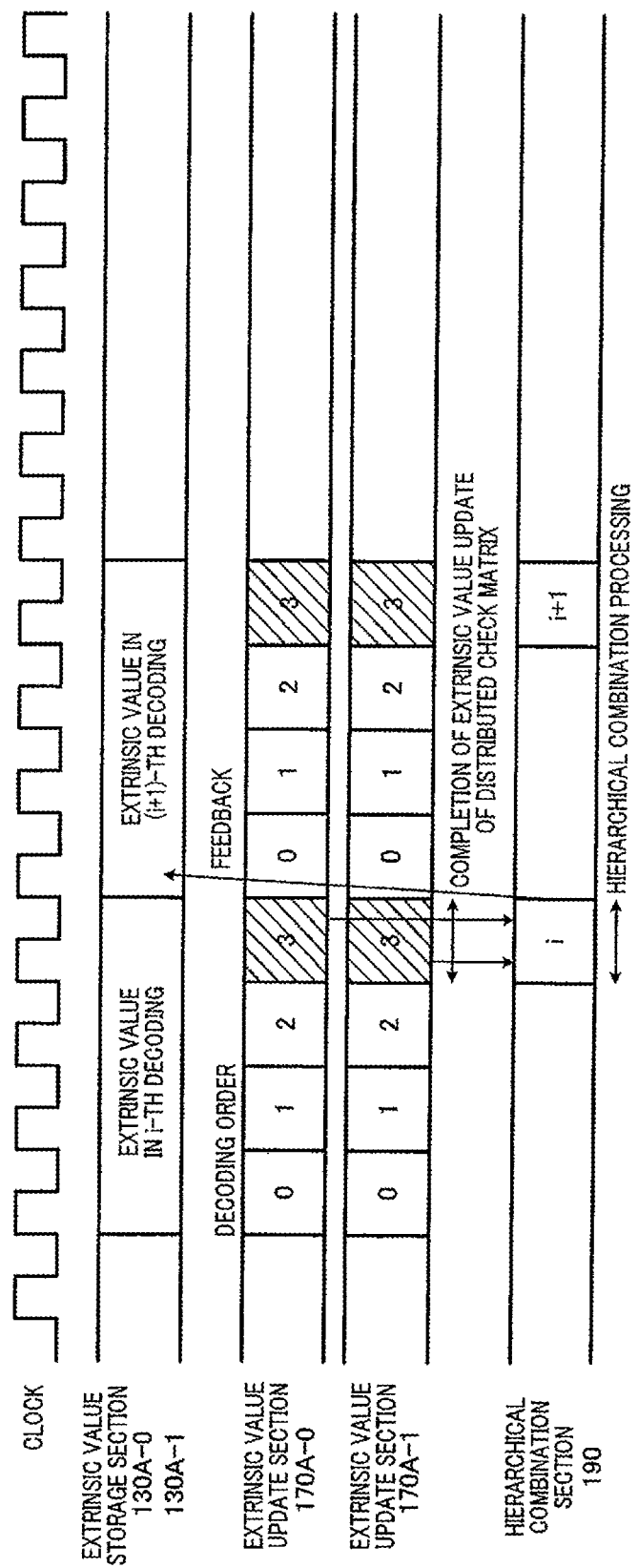
FIG. 12 is a diagram illustrating a time chart of a decoding process in the decoder shown in FIG. 10.

FIG. 12 is a diagram showing the time chart of the decoding process in decoder 100A shown in FIG. 10. FIG. 12 shows processing in extrinsic value update sections 170A-0 and 170A-1 as an example.

Extrinsic value update sections 170A-0 and 170A-1 update extrinsic values in the decoding order shown in FIG. 8. Upon completion of the extrinsic value update in the third decoding order, the i-th decoding process on the entire distributed check matrix shown in FIG. 7 is completed. Simultaneously with the completion of the extrinsic value update, hierarchical combination section 190 performs hierarchical combination processing using logarithmic extrinsic value ratios outputted from extrinsic value update sections 170A-0 and 170A-1. Hierarchical combination section 190 feeds back the logarithmic extrinsic value ratios after the hierarchical combination to extrinsic value storage sections 130A-0 and 130A-2. When the feedback is completed, the (i+1)-th decoding process starts.

Decoder 100A shown in FIG. 10 includes hierarchical combination section 190 independently of extrinsic value update sections 170A-1 to 170A-7. Therefore, hierarchical combination section 190 can perform hierarchical combination processing at the same time as extrinsic value update sections 170A-1 to 170A-7 complete the extrinsic value update processing. This makes it possible to minimize the number of processing cycles required to perform the decoding process one time in the iterative decoding process. As shown in FIG. 12, when hierarchical combination section 190 is provided independently, the number of cycles required to perform the decoding process one time is four.

Figure 11:
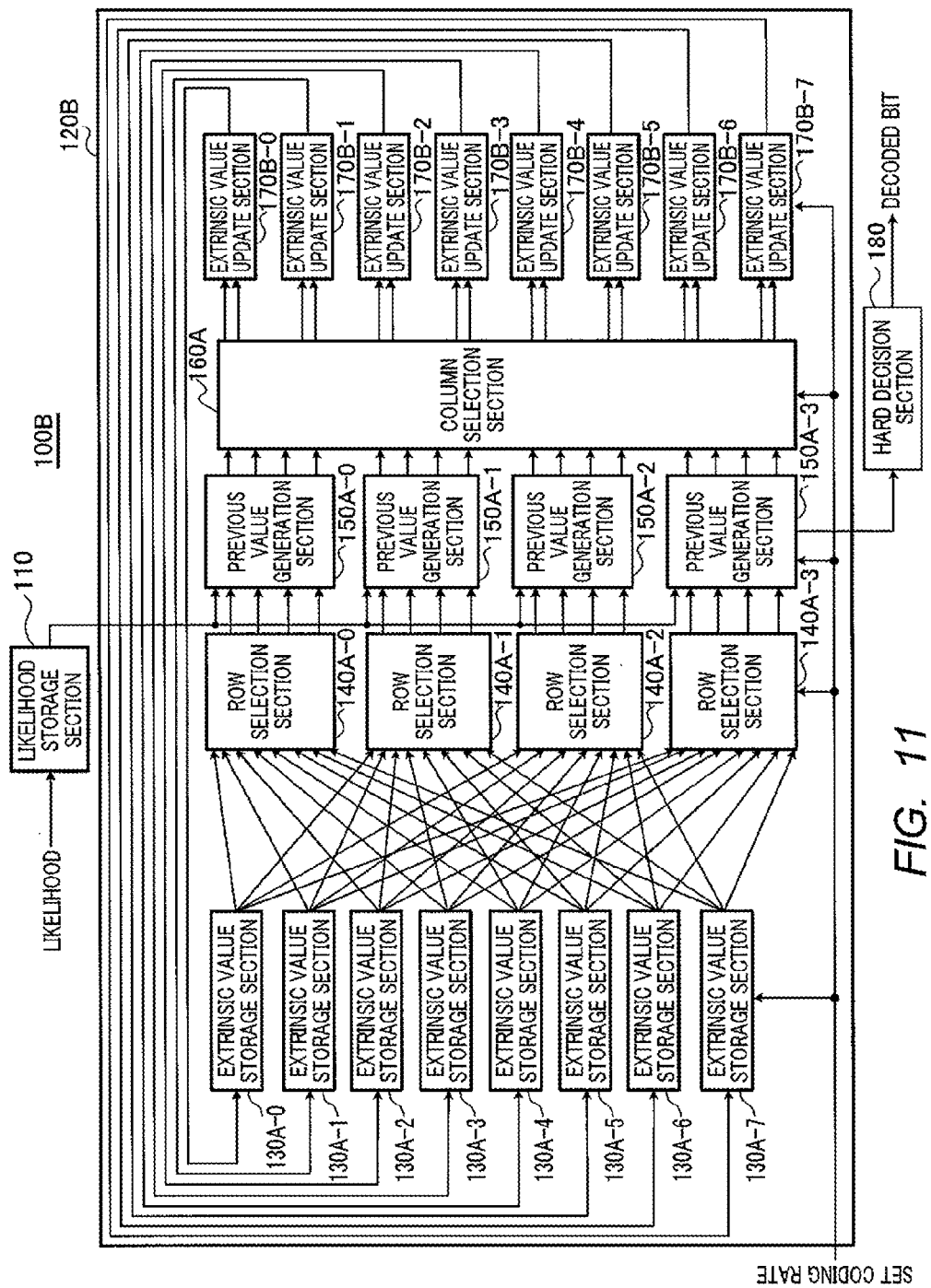
FIG. 11 is a diagram illustrating another configuration of main parts of a shared decoder according to the above embodiment.
Figure 13:
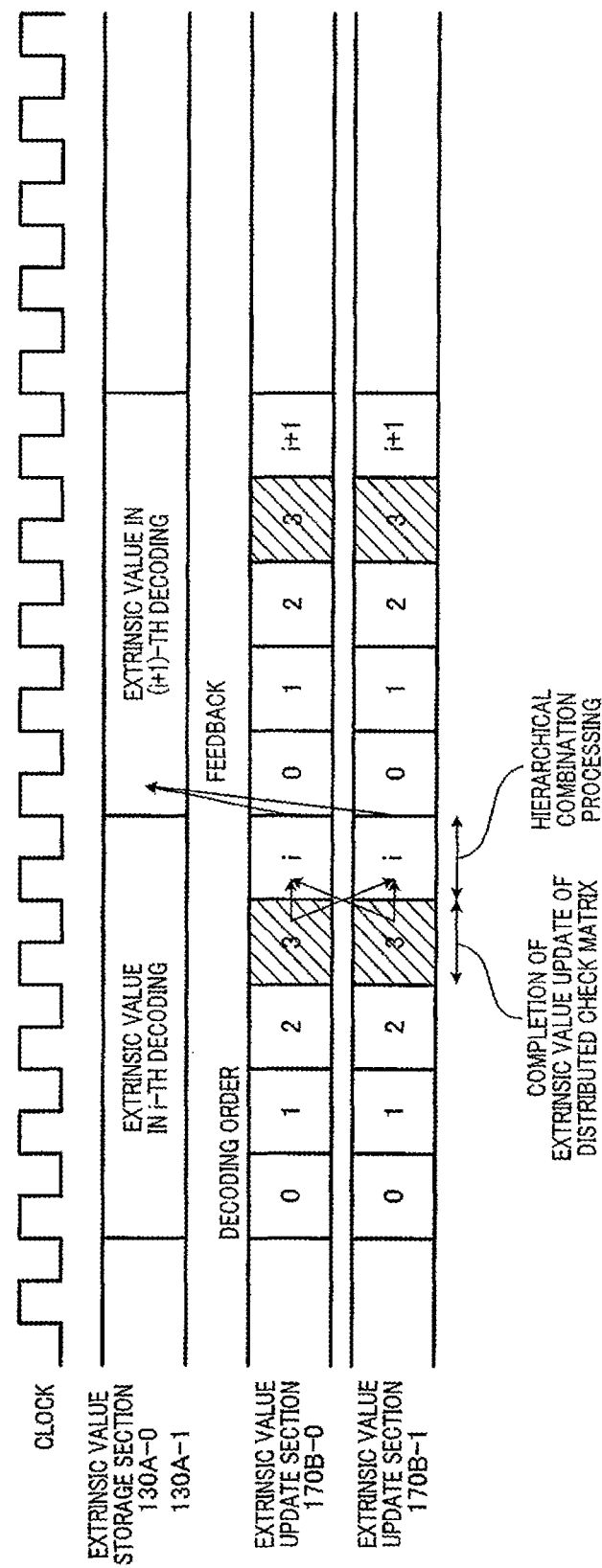
FIG. 13 is a diagram illustrating a time chart of a decoding process in the decoder shown in FIG. 11.

On the other hand, FIG. 13 is a diagram showing a time chart of the decoding process in decoder 100B shown in FIG. 11. For comparison with FIG. 12, FIG. 13 illustrates the processing in extrinsic value update sections 170B-0 and 170B-1. Here, a case will be described where extrinsic value update sections 170B-0 and 170B-1 calculate logarithmic extrinsic value ratios corresponding to rows of the distributed check matrix whose row weight is distributed.

Extrinsic value update sections 170B-0 and 170B-1 update extrinsic values in the decoding order shown in FIG. 8. When updating of extrinsic values in the third decoding order is completed and the i-th decoding process is completed, hierarchical combination processing is performed in the next processing cycle. Upon completing the hierarchical combination processing, extrinsic value update sections 170B-0 and 170B-1 feed back the obtained logarithmic extrinsic value ratios to extrinsic value storage sections 130A-0 and 130A-2. When the feedback is completed, the (i+1)-th decoding process starts.

In FIG. 11, extrinsic value update section 170B-1 outputs the logarithmic extrinsic value ratio updated in the third decoding order to extrinsic value update section 130A-0. Furthermore, extrinsic value update section 170B-0 performs hierarchical combination processing shown in equations 13-1 to 13-4 using the logarithmic extrinsic value ratio updated in the third decoding order and the logarithmic extrinsic value ratio inputted from extrinsic value update section 170B-1.

When a distributed check matrix is formed, if there are a plurality of rows whose row weight is distributed, extrinsic value update sections 170B-p and 170B-(p+1) (p is a positive even number) that calculate logarithmic extrinsic values corresponding to the rows perform hierarchical combination processing in the same way as extrinsic value update sections 170B-0 and 170B-1.

Extrinsic value update sections 170B-0 and 170B-1 distribute the logarithmic extrinsic value ratio obtained through a hierarchical combination to logarithmic extrinsic value ratios corresponding to the distributed rows, and extrinsic value update sections 170B-0 and 170B-1 output the distributed logarithmic extrinsic value ratios to extrinsic value storage sections 130A-0 and 130A-1.

Thus, decoder 100B shown in FIG. 11 does not separately provide hierarchical combination section 190 and performs hierarchical combination processing using the comparator making up extrinsic value update section 170B-k (k=0 to 7). In this case, as shown in FIG. 13, the number of processing cycles required to perform the decoding process one time is five. As a result, as shown in FIG. 10, the number of cycles for the decoding process increases compared to the case of adopting a configuration in which hierarchical combination section 190 is provided independently of extrinsic value update section 170A-k (k=0 to 7). However, it is possible to use the same comparator as the comparator required for hierarchical combination processing and as the comparator provided for extrinsic value update section 170B-k (k=0 to 7) and thereby reduce the circuit scale of decoder 100B compared to decoder 100A.

Thus, decoder 100A in FIG. 10 is suitable for use in shortening the time for the decoding process and has a configuration suitable for a one-to-one data communication mode, for example. On the other hand, decoder 100B in FIG. 11 takes slightly longer time for the decoding process, but can further reduce the circuit scale and has a configuration suitable for a broadcasting system or a one-to-multiple multicast data communication mode, for example.

The disclosure of Japanese Patent Application No. 2010-177538, filed on Aug. 6, 2010, including the specification, drawings and abstract is incorporated herein by reference in its entirety.

INDUSTRIAL APPLICABILITY

The error correcting decoding apparatus and error correcting decoding method according to the present invention are suitable for use in a communication apparatus using LDPC code or the like. Furthermore, the present apparatus and method are also applicable to a broadcasting receiving apparatus, storage media or the like.

REFERENCE SIGNS LIST

100, 100A, 100B decoder
110 likelihood storage section
120, 120A, 120B column processing/row processing calculation section
130-0 to 130-7, 130A-0 to 130A-7 extrinsic value storage section
140-0 to 140-3, 140A-0 to 140A-3 row selection section
150-0 to 150-3, 150A-0 to 150A-3 prior value generation section
160, 160A column selection section
170-0 to 170-7, 170A-0 to 170A-7, 170B-0 to 170B-7 extrinsic value update section
180 hard decision section
190 hierarchical combination section

The invention claimed is:

1. An error correcting decoding apparatus that decodes a coded bit which is subjected to low-density parity check code of a code rate selected from among a plurality of code rates, comprising:
   a storage section that stores a likelihood obtained by receiving the coded bit;
   a calculation section that calculates a soft decision value by repeating column processing and row processing using the likelihood and a first partial matrix generated from a predetermined check matrix; and
   a decision section that decides the decoded bit using the soft decision value, wherein
   the first partial matrix is a matrix resulting from selecting a combination in which each row weight of each partial matrix is equal to or less than a predetermined number from the predetermined check matrix for each column.

2. The error correcting decoding apparatus according to claim 1, wherein the calculation section calculates the soft decision value by repeating column processing and row processing using a second partial matrix generated by being selected for each column from a second check matrix to which a row for distributing non-zero elements of the check matrix is added.

3. The error correcting decoding apparatus according to claim 2, further comprising a hierarchical combiner that selects one of rows of the check matrix whose non-zero elements are distributed based on a logarithmic extrinsic value which is a minimum value of the value obtained through row processing in a min-sum decoding process.

4. The error correcting decoding apparatus according to claim 2, wherein when the number of the predetermined check matrices is plural, the number of rows of the second check matrix is equal to or less than the number of rows of a check matrix having the largest number of rows.

5. The error correcting decoding apparatus according to claim 4, wherein the predetermined check matrix comprises a check matrix whose column weight is greater than that of the second check matrix.

6. The error correcting decoding apparatus according to claim 2, wherein the calculation section uses a matrix having as many columns as columns of the first partial matrix as the second partial matrix.

7. The error correcting decoding apparatus according to claim 2, wherein the predetermined check matrix comprises a plurality of matrices corresponding to the selected code rate, and
the calculation section comprises:
an extrinsic value storage section that outputs a logarithmic extrinsic value ratio which is a minimum value of the value obtained through row processing in a min-sum decoding process;
a row setting section that sets the logarithmic extrinsic value ratio corresponding to the first partial matrix or the second partial matrix according to the selected code rate;
a prior value generating section that generates and rearranges a logarithmic prior value ratio according to the selected code rate and the set logarithmic extrinsic value ratio;
a column setting section that sets the logarithmic prior value ratio corresponding to the first partial matrix or the second partial matrix according to the selected code rate;
an extrinsic value update section that updates the logarithmic extrinsic value ratio according to the set logarithmic prior value ratio; and
a hard decision section that decides the decoded bit based on the logarithmic prior value ratio.

8. The error correcting decoding apparatus according to claim 7, wherein the number of inputs of the extrinsic value update section is equal to or less than the row weight of the first partial matrix.

9. An error correcting decoding method for decoding a coded bit which is subjected to low-density parity check code of a code rate selected from among a plurality of code rates, comprising:
storing a likelihood obtained by receiving the coded bit;
calculating a soft decision value by repeating column processing and row processing using the likelihood and a first matrix generated from a predetermined check matrix; and
deciding the decoded bit using the soft decision value, wherein:
the first partial matrix is a matrix resulting from selecting a combination in which each row weight of each partial matrix is equal to or less than a predetermined number from the predetermined check matrix for each column.

* * * * *